US012776281B2

(12) United States Patent
Kim

(10) Patent No.: US 12,776,281 B2
(45) Date of Patent: Oct. 27, 2026

(54) ELECTRONIC DEVICE

(71) Applicant: Samsung Display Co., Ltd., Yongin-si (KR)

(72) Inventor: Sujeong Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 19/212,896

(22) Filed: May 20, 2025

(65) Prior Publication Data

US 2025/0279070 A1 Sep. 4, 2025

Related U.S. Application Data

(62) Division of application No. 18/401,981, filed on Jan. 2, 2024, now Pat. No. 12,340,759.

(30) Foreign Application Priority Data

Apr. 17, 2023 (KR) ........................ 10-2023-0050216

(51) Int. Cl.

*G09G 3/3275* (2016.01)
*H10W 72/30* (2026.01)
*H10W 90/00* (2026.01)

(52) U.S. Cl.

CPC ......... *G09G 3/3275* (2013.01); *H10W 72/325* (2026.01); *H10W 72/352* (2026.01); *H10W 72/354* (2026.01); *H10W 90/732* (2026.01)

(58) Field of Classification Search

CPC ............. G09G 3/3275; H10W 90/732; H10W 72/354; H10W 72/325; H10W 72/352
See application file for complete search history.

(56) References Cited

U.S. PATENT DOCUMENTS

| | | | | |
|---|---|---|---|---|
| 10,303,315 | B2 * | 5/2019 | Jeong | G06F 3/0443 |
| 10,490,755 | B2 | 11/2019 | Jang et al. | |
| 2001/0033009 | A1 | 10/2001 | Inoue et al. | |
| 2010/0073358 | A1 * | 3/2010 | Ozaki | G09G 3/325 345/76 |
| 2015/0115292 | A1 | 4/2015 | Jeon et al. | |
| 2015/0205418 | A1 | 7/2015 | Nam et al. | |
| 2016/0259469 | A1 | 9/2016 | Kim et al. | |

(Continued)

FOREIGN PATENT DOCUMENTS

| | | | |
|---|---|---|---|
| EP | 3996141 | A1 | 5/2022 |
| KR | 1020230110404 | A | 7/2023 |

*Primary Examiner* — Ariel A Balaoing
(74) *Attorney, Agent, or Firm* — CANTOR COLBURN LLP

(57) ABSTRACT

An electronic device includes: a display panel including a first pad; a data driver including a second pad disposed to overlap the first pad in a thickness direction of the display panel and disposed on the display panel; and an adhesive layer disposed between the display panel and the data driver. The adhesive layer includes: an adhesive resin in contact with the display panel and the data driver; and a conductive particle disposed inside the adhesive resin and in contact with and electrically connected to the display panel and the data driver. The data driver includes a groove defined in a surface thereof facing the display panel, and a length of the groove in a first direction perpendicular to the thickness direction is smaller than or equal to a diameter of the conductive particle.

10 Claims, 15 Drawing Sheets

(56) References Cited

U.S. PATENT DOCUMENTS

| | | | | |
|---|---|---|---|---|
| 2018/0145124 | A1 | 5/2018 | Kim et al. | |
| 2020/0077518 | A1* | 3/2020 | Kim | H05K 1/118 |
| 2020/0264468 | A1 | 8/2020 | Park et al. | |
| 2021/0050398 | A1* | 2/2021 | Kim | H10K 59/1201 |
| 2021/0126083 | A1 | 4/2021 | Moon et al. | |
| 2021/0202633 | A1* | 7/2021 | Song | G09G 3/3233 |
| 2021/0307174 | A1 | 9/2021 | Jang | |
| 2021/0375804 | A1* | 12/2021 | Kang | H05K 3/323 |
| 2022/0377908 | A1 | 11/2022 | Kim et al. | |
| 2023/0015124 | A1 | 1/2023 | Ryu et al. | |
| 2023/0247874 | A1 | 8/2023 | Youk et al. | |
| 2024/0122011 | A1 | 4/2024 | Woo et al. | |
| 2025/0006878 | A1* | 1/2025 | Wang | H10H 20/857 |

* cited by examiner

ELECTRONIC DEVICE

This application is a divisional of U.S. patent application Ser. No. 18/401,981, filed on Jan. 2, 2024, which claims priority to Korean Patent Application No. 10-2023-0050216 filed on Apr. 17, 2023, and all the benefits accruing therefrom under 35 U.S.C. § 119, the content of which in its entirety is herein incorporated by reference.

BACKGROUND

Embodiments of the present disclosure described herein relate to an electronic device, and more particularly, to an electronic device including a display panel and a data driver bonded to each other.

Multimedia electronic devices such as televisions, mobile phones, tablet personal computers ("PCs"), navigation devices, and game consoles may include display modules that display images and detect external inputs.

The display module may be electrically bonded and electrically connected to a data driver that provides an electrical signal for displaying an image.

SUMMARY

Embodiments of the present disclosure provide an electronic device having improved electrical connection characteristics between a display panel and a data driver.

According to an embodiment, an electronic device includes: a display panel including a first pad; a data driver including a second pad disposed to overlap the first pad in a thickness direction of the display panel and disposed on the display panel; and an adhesive layer disposed between the display panel and the data driver. The adhesive layer includes: an adhesive resin in contact with the display panel and the data driver, and a conductive particle disposed inside the adhesive resin and in contact with and electrically connected to the display panel and the data driver. The data driver includes a groove defined in a surface thereof facing the display panel, and a length of the groove in a first direction perpendicular to the thickness direction is smaller than or equal to a diameter of the conductive particle.

The data driver may further include an insulating layer defining an opening exposing a portion of the second pad and disposed under the second pad, and a conductive layer in which the groove is defined and which is disposed under the insulating layer while covering the exposed portion of the second pad, and the conductive particle may be in contact with and electrically connected to the conductive layer of the data driver.

The conductive particle may be in contact with and electrically connected to the first pad of the display panel.

A shortest distance between the display panel and the data driver in the thickness direction may be smaller than or equal to the diameter of the conductive particle.

The adhesive layer may be an anisotropic conductive film.

A length of the groove in a second direction perpendicular to both the first direction and the thickness direction may be smaller than or equal to the diameter of the conductive particle.

According to an embodiment, an electronic device includes: a display panel including a first pad; a data driver including a second pad disposed to overlap the first pad in a thickness direction of the display panel and disposed on the display panel; and an adhesive layer disposed between the display panel and the data driver. The adhesive layer includes: an adhesive resin in contact with the display panel and the data driver, and a conductive particle disposed inside the adhesive resin and in contact with and electrically connected to the display panel and the data driver. The data driver defines a plurality of grooves arranged in a surface thereof facing the display panel and spaced apart from each other in a second direction perpendicular to the thickness direction, and lengths of the plurality of grooves in the second direction and lengths of the plurality of grooves in a first direction are each smaller than or equal to a diameter of the conductive particle.

The data driver may further include an insulating layer defining a plurality of openings exposing a portion of the second pad and disposed under the second pad, and a conductive layer in which the plurality of grooves are defined and which is disposed under the insulating layer while covering the exposed portion of the second pad, and the conductive particle may be in contact with and electrically connected to the conductive layer of the data driver.

The conductive particle may be in contact with and electrically connected to the first pad of the display panel.

A shortest distance between the display panel and the data driver in the thickness direction may be smaller than or equal to the diameter of the conductive particle.

The adhesive layer may be an anisotropic conductive film.

According to an embodiment, an electronic device includes: a display panel including a first pad; a data driver including a second pad disposed to overlap the first pad in a thickness direction of the display panel and disposed on the display panel, and an adhesive layer disposed between the display panel and the data driver. The first pad includes: a first conductive pattern, an insulating pattern disposed on the first conductive pattern and configured to define a protrusion protruding in a direction from the display panel toward the data driver, and a second conductive pattern disposed on the insulating pattern. The second conductive pattern is in contact with and electrically connected to the data driver, the data driver includes a groove defined in a surface thereof facing the display panel, and a length of the groove in a first direction perpendicular to the thickness direction is smaller than or equal to a length of a top surface of the second conductive pattern in the first direction.

The data driver may further include: an insulating layer defining an opening exposing a portion of the second pad and disposed under the second pad, and a conductive layer in which the groove is defined and which is disposed under the insulating layer while covering the exposed portion of the second pad, and the second conductive pattern may be in contact with and electrically connected to the conductive layer of the data driver.

A length of the opening of the insulating layer in the first direction may be smaller than or equal to ⅓ a length of the second pad in the first direction.

The adhesive layer may be a non-conductive film.

The insulating pattern may include a polymer.

According to an embodiment, an electronic device includes: a display panel including a first pad; a data driver including a second pad disposed to overlap the first pad in a thickness direction of the display panel and disposed on the display panel; and an adhesive layer disposed between the display panel and the data driver. The first pad includes: a first conductive pattern, an insulating pattern disposed on the first conductive pattern and configured to define a plurality of protrusions protruding in a direction from the display panel toward the data driver, and a second conductive pattern disposed on the insulating pattern. Protruding portions of the second conductive pattern corresponding to the plurality of protrusions of the insulating pattern are in contact with and electrically connected to the data driver, the data driver defines a plurality of grooves arranged in a surface thereof facing the display panel and spaced apart from each other in a second direction perpendicular to the thickness direction, a length of each of the plurality of grooves in a first direction perpendicular to both the thickness direction and the second direction is smaller than or equal to a length of each of top surfaces of the protruding portions of the second conductive pattern in the first direction, and a length of each of the plurality of grooves in the second direction is smaller than or equal to a length of each of the top surfaces of the protruding portions of the second conductive pattern in the second direction.

The data driver may include an insulating layer defining a plurality of openings exposing a portion of the second pad and disposed under the second pad, and a conductive layer in which the plurality of grooves are defined and which is disposed under the insulating layer while covering the exposed portion of the second pad, and the protruding portions of the second conductive pattern may be in contact with and electrically connected to the conductive layer of the data driver.

A length of each of the plurality of openings of the insulating layer in the first direction may be smaller than or equal to ⅓ a length of the second pad in the first direction.

The adhesive layer may be a non-conductive film.

The insulating pattern may include a polymer.

BRIEF DESCRIPTION OF THE FIGURES

The above and other aspects and features of the present disclosure will become apparent by describing in detail embodiments thereof with reference to the accompanying drawings.

DETAILED DESCRIPTION

Figure 1:
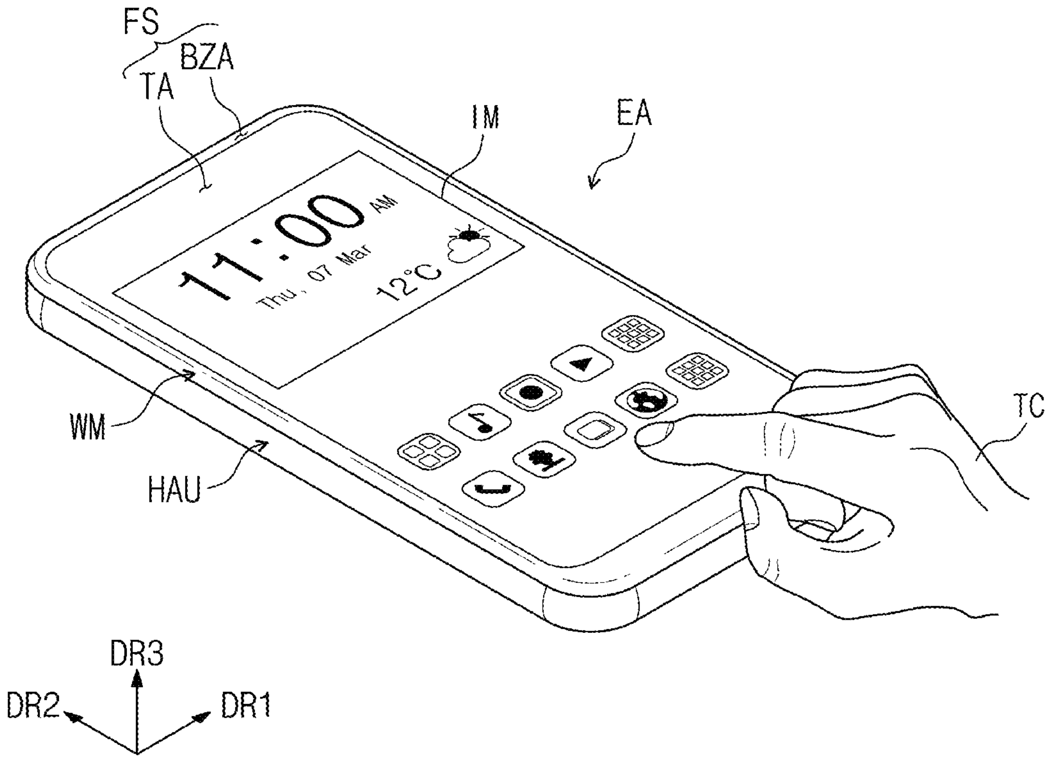
FIG. 1 is a perspective view of a coupling state of an electronic device according to an embodiment of the present disclosure.

Since the present disclosure is variously modified and has alternative forms, an embodiment thereof will be illustrated in the drawings and will herein be described in detail. However, it should be understood that the present disclosure is not limited to a specific disclosure and includes all changes, equivalents, and substitutes included in the spirit and scope of the present disclosure.

Singular expressions used herein include plural expressions unless clearly otherwise indicated in the context.

It should be understood in the present specification that terms such as "include" or "have" are intended to indicate that features, numbers, steps, operations, components, parts, or combinations thereof described in the specification are present and do not exclude in advance the possibility of the presence or addition of one or more other features, numbers, steps, operations, components, parts, or combinations thereof.

In the present specification, the expression that a first component (or an area, a layer, a part, a portion, etc.) is "disposed on", "connected with" or "coupled to" a second component means that the first component is directly disposed on/connected with/coupled to the second component or means that a third component is interposed therebetween.

In the present specification, the terms "under", "below", "on", "above", etc. are used to describe the correlation of components illustrated in drawings. The terms that are relative in concept are described based on a direction illustrated in drawings.

In the present specification, the expression "arranged on" may indicate a case in which a first component is arranged not only on an upper part but also on a lower part of a second component.

In the present specification, the expression "directly arranged" may mean that a layer, a film, a region, a plate, and the like added between parts such as a layer, a film, a region, and a plate and another part are not present. For example, the expression "directly arranged" may mean that two layers or two members are arranged without an additional member such as an adhesive member therebetween.

In the present specification, the term "and/or" includes all combinations of one or more components that may be defined by associated components.

In the present specification, although the terms "first", "second", etc. may be used to describe various components, the components should not be limited by the terms. The terms are only used to distinguish one component from another component. For example, without departing from the scope of the present invention, a first component may be referred to as a second component, and similarly, a second component may be referred to as a first component.

Unless otherwise defined, all terms (including technical terms and scientific terms) used in the present specification have the same meaning as commonly understood by those skilled in the art to which the present disclosure belongs. Furthermore, terms such as terms defined in the dictionaries commonly used should be interpreted as having a meaning consistent with the meaning in the context of the related technology and should not be interpreted in overly ideal or overly formal meanings unless explicitly defined herein.

The same reference numerals refer to the same components. Further, in the drawings, the thickness, the ratio, and the dimension of components are exaggerated for effective description of technical contents.

Hereinafter, an electronic device according to an embodiment of the present disclosure will be described with reference to the accompanying drawings.

Figure 2:
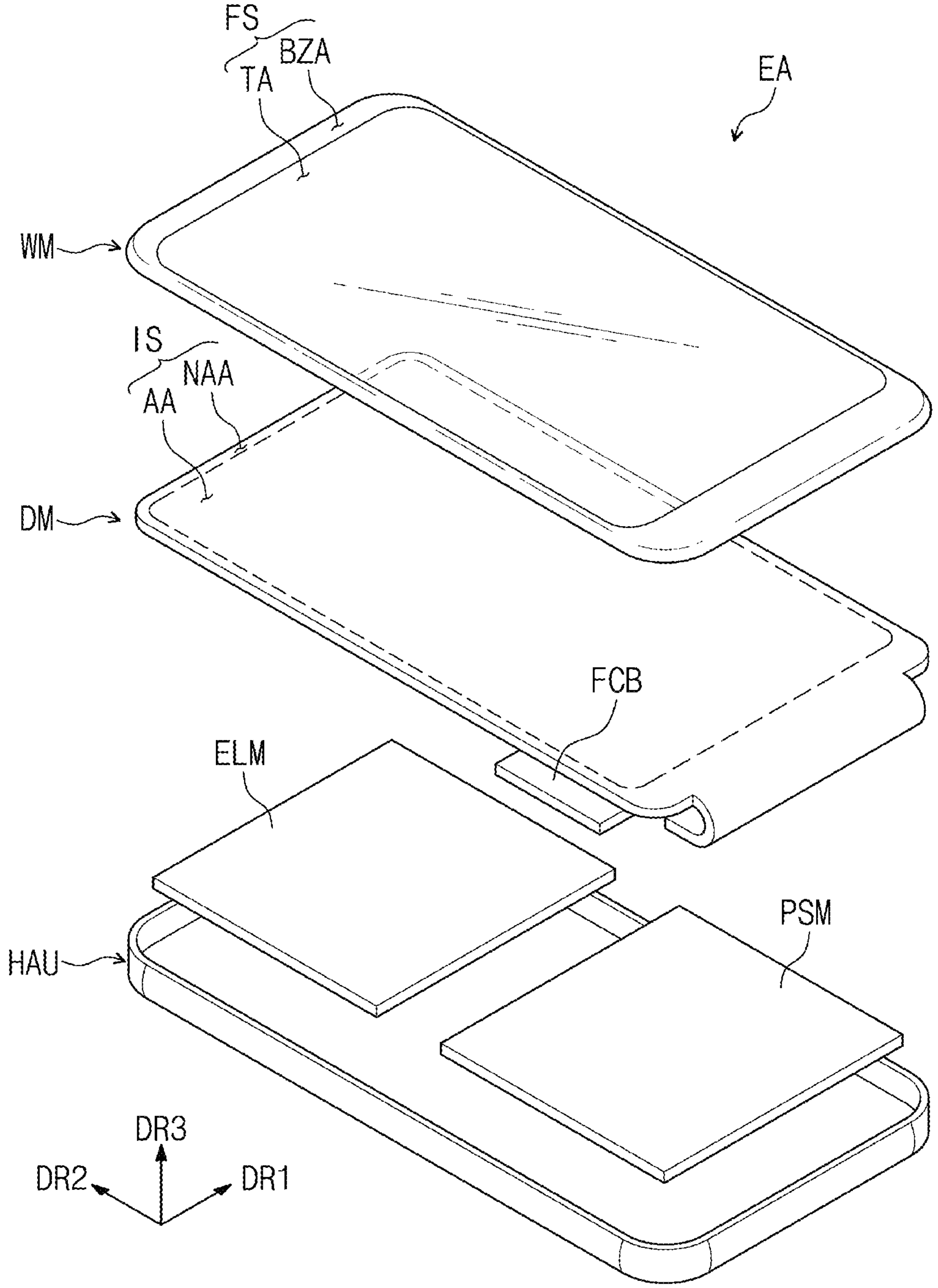
FIG. 2 is an exploded perspective view of the electronic device according to an embodiment of the present disclosure.

FIG. 1 is a perspective view of a coupling state of an electronic device EA according to an embodiment of the present disclosure. FIG. 2 is an exploded perspective view of the electronic device EA according to an embodiment of the present disclosure.

Referring to FIGS. 1 and 2, the electronic device EA may be a device that is activated according to an electrical signal, displays an image IM, and detects an external input TC. In an embodiment, for example, the electronic device EA may include devices such as monitors, mobile phones, tablet personal computers (PCs), navigation devices, and game consoles. However, an embodiment of the electronic device EA is illustrative, and is not limited to any one unless an embodiment does not depart from the concept of the present disclosure. In an embodiment, the electronic device EA is illustratively illustrated as a mobile phone.

The electronic device EA may have a rectangular shape having short sides extending in a first direction DR1 and long sides extending in a second direction DR2 intersecting the first direction DR1 in a plan view. However, the present disclosure is not limited thereto, and the electronic device EA may have various shapes such as a circle and a polygon in a plan view in another embodiment.

In an embodiment, a third direction DR3 may be defined as a direction perpendicular to a plane defined by the first direction DR1 and the second direction DR2. A front surface (or an upper surface) and a rear surface (or a lower surface) of each of members constituting the electronic device EA may be opposite to each other in the third direction DR3, and a normal direction of each of the front surface and the rear surface may be substantially parallel to the third direction DR3. A separation distance between the front surface and the rear surface defined in the third direction DR3 may correspond to a thickness of the member.

In the present specification, the wording "a plan view" is defined as a state viewed in the third direction DR3 (i.e., thickness direction of the display panel DP). In the present specification, the wording "on a cross section" is defined as a state viewed from the first direction DR1 or the second direction DR2. Meanwhile, directions indicated by the first to third directions DR1, DR2, and DR3 are relative concepts and may be changed to other directions.

The electronic device EA may be rigid or flexible. The wording "flexible" may mean a property that may be bent and include a structure that is completely folded and a structure that may be bent by several nanometers. In an embodiment, for example, the flexible electronic device EA may include a curved electronic device, a rollable electronic device, and a foldable electronic device.

The electronic device EA may display the image IM through a display surface FS parallel to the first direction DR1 and the second direction DR2. The image IM may include a still image as well as a dynamic image. In FIG. 1, a watch and icons are illustrated as an example of the image IM.

The display surface FS of the electronic device EA may include only a flat surface or may further include a curved surface bent from at least one side of the flat surface. The display surface FS may correspond to a front surface of the electronic device EA, and at the same time, may correspond to a front surface of a window WM. Hereinafter, the same reference numeral is used for the display surface FS of the electronic device EA and the front surface FS of the window WM.

The electronic device EA according to an embodiment may detect the external input TC applied from the outside. The external input TC may include various types of inputs such as a force, a pressure, a temperature, or a light beam. In an embodiment, the external input TC is illustrated as a hand of a user applied to the front surface of the electronic device EA. However, this is illustratively illustrated, and the external input TC may include an input, which is applied close to the electronic device EA, such as contact with a pen or hovering.

The electronic device EA may detect an input of the user through the display surface FS defined on the front surface and respond to the detected input signal. However, an area of the electronic device EA that detects the external input TC is not limited to the front surface of the electronic device EA and may be changed according to a design of the electronic device EA. In an embodiment, for example, the electronic device EA may detect the input of the user applied to a side surface or rear surface of the electronic device EA.

The electronic device EA may include the window WM, a display module DM, an electronic module ELM, a power supply module PSM, and a housing HAU. The window WM and the housing HAU may be coupled to each other to constitute an exterior of the electronic device EA.

The window WM may be disposed on the display module DM. The window WM may cover a front surface IS of the display module DM and protect the display module DM from external impacts and scratches. The window WM may be coupled to the display module DM through an adhesive layer.

The window WM may include an optically transparent insulating material. In an embodiment, for example, the window WM may include glass or a synthetic resin as a base film. The window WM may have a single-layer structure or a multi-layer structure. In an embodiment, for example, the multi-layered window WM may include synthetic resin films bonded with an adhesive or may include a glass film and a synthetic resin film bonded with an adhesive. The window WM may further include functional layers, such as an anti-fingerprint layer, a phase control layer, and a hard coating layer, which are arranged on the transparent base film.

The front surface FS of the window WM may correspond to the front surface of the electronic device EA. The front surface FS of the window WM may include a transmissive area TA and a bezel area BZA.

The transmissive area TA may be an optically transparent area. The transmissive area TA may transmit the image IM provided by the display module DM. In an embodiment, the transmissive area TA is illustrated as a quadrangular shape, but the present disclosure is not limited thereto, and the transmissive area TA may have various shapes.

The bezel area BZA may be an area having lower light transmittance than light transmittance of the transmissive area TA. The bezel area BZA may correspond to an area on which a material having a predetermined color is printed. The bezel area BZA may prevent transmission of light to prevent one component of the display module DM disposed to overlap the bezel area BZA from being visually recognized form the outside in a plan view.

The bezel area BZA may be adjacent to the transmissive area TA. A shape of the transmissive area TA may be substantially defined by the bezel area BZA. In an embodiment, for example, the bezel area BZA may be disposed outside the transmissive area TA and surround the transmissive area TA. However, this is illustratively illustrated, and the bezel area BZA may be adjacent to only one side of the transmissive area TA or may be disposed not on the front surface but on the side surface of the electronic device EA. Further, the bezel area BZA may be omitted.

The display module DM may be disposed between the window WM and the housing HAU. The display module DM may display the image IM and detect the external input TC. The image IM may be displayed on the front surface IS of the display module DM. The front surface IS of the display module DM may include an active area AA and a peripheral area NAA.

The active area AA may be an area that is activated according to an electric signal. In an embodiment, for example, the active area AA may be an area on which the image IM is displayed, and at the same time, may be an area in which the external input TC is detected. The active area AA may at least partially overlap the transmissive area TA in a plan view. Accordingly, the user may visually recognize the image IM or provide the external input TC through the transmissive area TA. However, this is illustrative, an area of the active area AA, on which the image IM is displayed, and an area of the active area AA, on which the external input TC is detected, may be separated from each other, and the present disclosure is not limited to an embodiment.

The peripheral area NAA may be adjacent to the active area AA. In an embodiment, for example, the peripheral area NAA may surround the active area AA. A driving circuit or driving wiring line for driving the active area AA may be disposed in the peripheral area NAA. The peripheral area NAA may at least partially overlap the bezel area BZA in a plan view, and components arranged in the peripheral area NAA may be prevented from visually recognized from the outside by the bezel area BZA.

The display module DM may include a display panel and an input detection unit. The display panel may display the image IM, and the input detection unit may detect the external input TC. A detailed description thereof will be described below.

A portion of the display module DM may be bent about a bending axis extending in the first direction DR1. That is, the portion of the display module DM may be bent toward a rear surface of the display module DM, corresponding to the active area AA. A flexible circuit board FCB may be connected to the bent portion of the display module DM, and accordingly, the flexible circuit board FCB may overlap the display module DM in a plan view.

The flexible circuit board FCB may be electrically connected to the display module DM on one side of the display module DM. The flexible circuit board FCB may generate an electrical signal provided to the display module DM or receive a signal generated by the display module DM to calculate a resultant value including information on a position in which the external input TC is detected or an intensity of the external input TC.

The electronic module ELM and the power supply module PSM may be arranged below the display module DM. The electronic module ELM and the power supply module PSM may be electrically connected through a separate circuit board.

The power supply module PSM may supply power for operating the electronic device EA. In an embodiment, for example, the power supply module PSM may include a general battery module.

The electronic module ELM may include various functional modules for operating the electronic device EA. In an embodiment, for example, the electronic module ELM may include a control module, a wireless communication module, an image input module, a sound input module, a sound output module, a memory, an optical module, an external interface module, or the like. The electronic module ELM may include a main circuit board, and the modules of the electronic module ELM may be mounted on the main circuit board or electrically connected to the main circuit board through a separate circuit board.

The control module among the electronic module ELM may control an overall operation of the electronic device EA. In an embodiment, for example, the control module may activate or deactivate the display module DM in accordance with the input of the user. The control module may include at least one microprocessor. The optical module among the electronic module ELM may include a camera module, a proximity sensor, a biometric sensor that recognizes a portion of a body of the user (for example, a fingerprint, an iris, or a face), a lamp that outputs a light beam, and the like.

The housing HAU may be coupled to the window WM to provide an internal space in which the display module DM, the electronic module ELM, the power supply module PSM, and the flexible circuit board FCB are accommodated. The housing HAU may include a material having a relatively high rigidity. In an embodiment, for example, the housing HAU may include a plurality of frames and/or plates made of a glass, a plastic, or a metal or combinations thereof. The housing HAU may protect components of the electronic device EA accommodated in the housing HAU by absorbing an impact applied from the outside or preventing foreign substances/moisture from penetrating from the outside.

Figure 3:
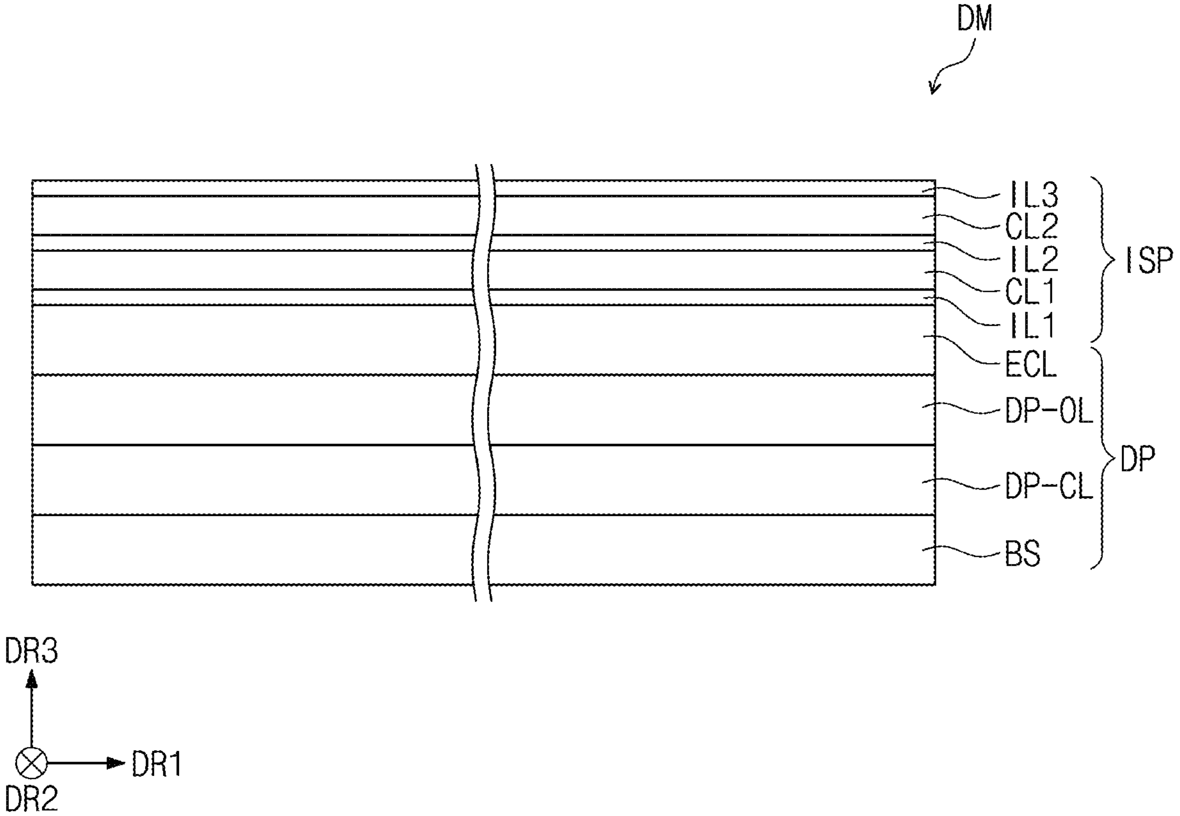
FIG. 3 is a cross-sectional view of a display module according to an embodiment of the present disclosure.

FIG. 3 is a cross-sectional view of the display module DM according to an embodiment of the present disclosure.

Referring to FIG. 3, the display module DM may include a display panel DP and an input detection unit ISP. The input detection unit ISP may be disposed on the display panel DP. In an embodiment, for example, the input detection unit ISP may be directly disposed on the display panel DP. In an embodiment, the wording "the input detection unit ISP is directly disposed on the display panel DP" means that the input detection unit ISP is formed on the display panel DP through a subsequent process, and thus the input detection unit ISP and the display panel DP are coupled without a separate adhesive layer. That is, components of the input detection unit ISP may be disposed on a base surface provided by the display panel DP.

The display panel DP may display an image according to the electrical signal. The display panel DP according to an embodiment may be a light emitting display panel, but the present disclosure is not particularly limited thereto. In an embodiment, for example, the display panel DP may be an organic light emitting display panel, an inorganic light emitting display panel, or a quantum dot light emitting display panel. A light emitting layer of the organic light emitting display panel may include an organic light emitting material, and a light emitting layer of the inorganic light emitting display panel may include an inorganic light emitting material. A light emitting layer of the quantum dot light emitting display panel may include a quantum dot and a quantum rod. Hereinafter, the display panel DP will be described as the organic light emitting display panel.

The display panel DP may include a base substrate BS, a circuit layer DP-CL, a display element layer DP-OL, and an encapsulation layer ECL that are sequentially laminated in the third direction DR3.

The base substrate BS may be a rigid substrate or a flexible substrate that may be bent, folded, and or rolled. In an embodiment, for example, the base substrate BS may be a glass substrate, a metal substrate, a polymer substrate, or the like. The base substrate BS may provide the base surface on which the circuit layer DP-CL is disposed.

The base substrate BS may include an inorganic layer, an organic layer, and a composite material layer. The base substrate BS may have a single-layer structure or a multi-layer structure. In an embodiment, for example, the multi-layered base substrate BS may include synthetic resin layers and a multi-layered or single-layered inorganic layer disposed between the synthetic resin layers. The synthetic resin layer may include acrylic resin, methacrylic resin, polyisoprene, vinyl resin, epoxy resin, urethane resin, cellulose resin, siloxane resin, polyamide resin, perylene resin, or the like, but the material of the synthetic resin layer is not limited thereto.

The circuit layer DP-CL may be disposed on the base substrate BS. The circuit layer DP-CL may include at least one insulating layer, a semiconductor pattern, and a conductive pattern. The insulating layer, the semiconductor pattern, and the conductive pattern included in the circuit layer DP-CL may form driving elements such as transistors, signal lines, and pads.

The display element layer DP-OL may be disposed on the circuit layer DP-CL. The display element layer DP-OL may include light emitting elements, each of which emits a light beam. In an embodiment, for example, the light emitting elements may include an organic light emitting element, an inorganic light emitting element, a micro light emitting diode ("LED"), a nano LED, or the like. The light emitting elements of the display element layer DP-OL are electrically connected to the driving elements of the circuit layer DP-CL and may thus emit a light beam according to electrical signals provided by the driving elements.

The encapsulation layer ECL may be disposed on the display element layer DP-OL to seal the light emitting elements. The encapsulation layer ECL may include at least one thin film for improving optical efficiency of the display element layer DP-OL or protecting the display element layer DP-OL. In an embodiment, for example, the encapsulation layer ECL may include at least one of an inorganic film and an organic film. The inorganic film of the encapsulation layer ECL may protect the light emitting elements from moisture/oxygen. The organic film of the encapsulation layer ECL may protect the light emitting elements from foreign substances such as dust particles.

The input detection unit ISP may detect an external input and provide an input signal including information on the external input so that the display panel DP may display an image corresponding to the external input. The input detection unit ISP may be driven in various methods such as a capacitive method, a resistive film method, an infrared method, a sonic method, or a pressure method, and the driving method of the input detection unit ISP is not limited to any one as long as the input detection unit ISP using the driving method may detect the external input. In an embodiment, the input detection unit ISP is described as an input detection panel driven in the capacitive method.

The input detection unit ISP may include a base layer IL1, a first detection conductive layer CL1, a first detection insulating layer IL2, a second detection conductive layer CL2, and a second detection insulating layer IL3, which are laminated in the third direction DR3. The base layer IL1 of the input detection unit ISP may be in contact with the encapsulation layer ECL. However, an embodiment is not limited thereto, and at least one of the base layer IL1 and the second detection insulating layer IL3 may be omitted in another embodiment.

Each of the first detection conductive layer CL1 and the second detection conductive layer CL2 may have a single-layered or multi-layered structure. The conductive layer having the multi-layered structure may include at least two of transparent conductive layers and metal layers. The multi-layered conductive layer may include metal layers including different metals. The transparent conductive layer may include at least one of indium tin oxide ("ITO"), indium zinc oxide ("IZO"), zinc oxide (ZnO), indium tin zinc oxide ("ITZO"), poly(3,4-ethylenedioxythiophene) ("PEDOT"), a metal nano wire, and a graphene. The metal layer may include at least one of molybdenum, silver, titanium, copper, aluminum, and alloys thereof. In an embodiment, for example, each of the first detection conductive layer CL1 and the second detection conductive layer CL2 may have a two-layered structure, for example, a two-layered structure of the ITO/copper, but the present disclosure is not limited thereto, and each of the first detection conductive layer CL1 and the second detection conductive layer CL2 may have a three-layered structure of titanium/aluminum/titanium in another embodiment.

Each of the first detection conductive layer CL1 and the second detection conductive layer CL2 may have detection conductive patterns. The detection conductive patterns of the first detection conductive layer CL1 and the second detection conductive layer CL2 may form detection electrodes constituting the input detection unit ISP and detection lines connected thereto.

Each of the base layer IL1, the first detection insulating layer IL2, and the second detection insulating layer IL3 may include at least one of an inorganic film and an organic film. In an embodiment, for example, the inorganic film may include at least one of aluminum oxide, titanium oxide, silicon oxide, silicon oxynitride, zirconium oxide, and hafnium oxide, and the organic film may include at least one of acrylic resin, methacrylic resin, polyisoprene, vinyl resin, epoxy resin, urethane resin, cellulose resin, siloxane resin, polyimide resin, polyamide resin, and perylene resin. However, the materials of the inorganic film and the organic film are not limited to the above example. In an embodiment, the base layer IL1 may include the inorganic film, and the first detection insulating layer IL2, and the second detection insulating layer IL3 may include the organic films, but an embodiment is not limited thereto.

Figure 4:
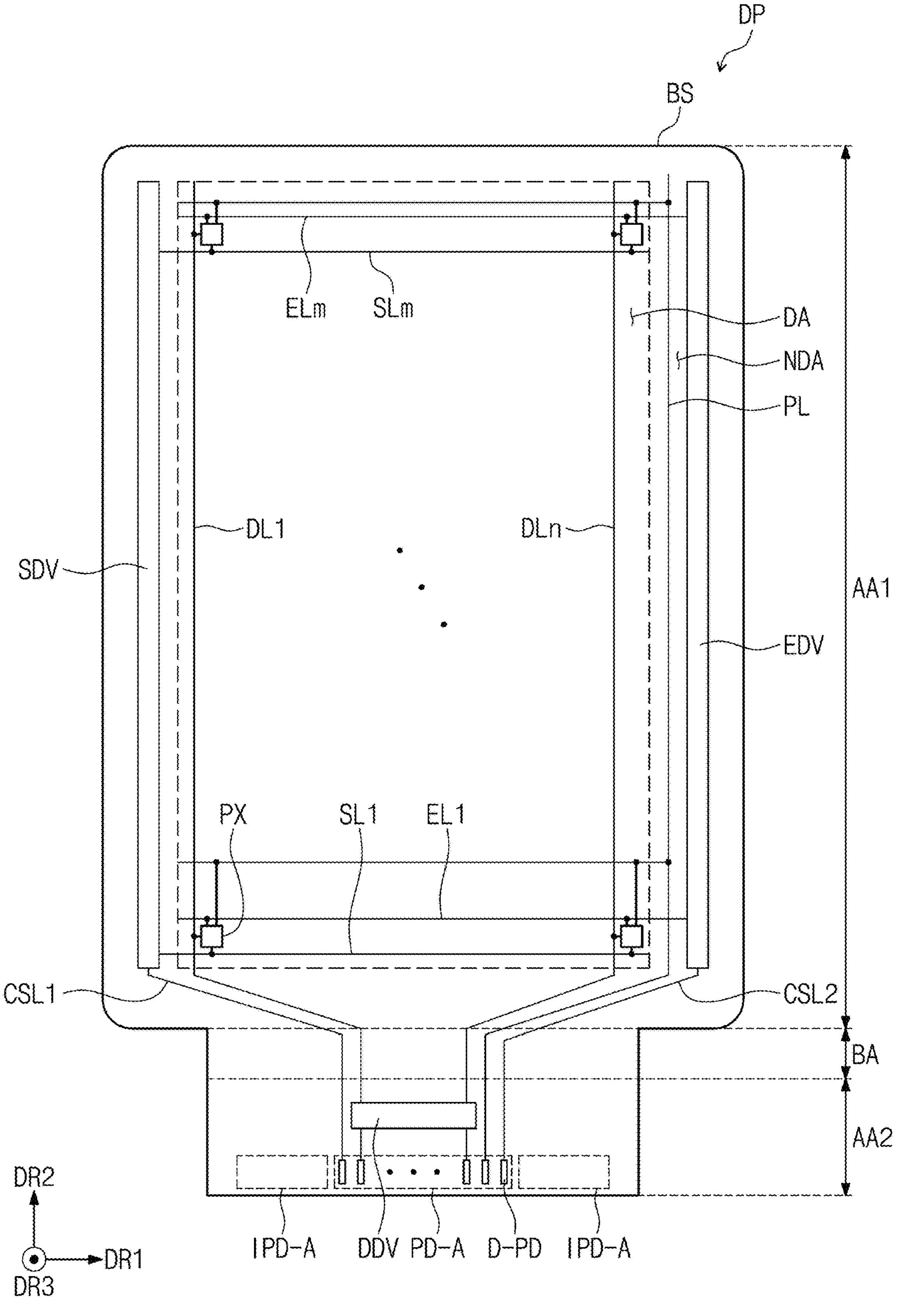
FIG. 4 is a plan view of a display panel according to an embodiment of the present disclosure.

FIG. 4 is a plan view of the display panel DP according to an embodiment of the present disclosure.

Referring to FIG. 4, the display panel DP may include the base substrate BS, pixels PX, signal lines SL1 to SLm, DL1 to DLn, EL1 to ELm, CSL1, CSL2, and PL electrically connected to the pixels PX, a scan driver SDV, an emission driver EDV, a data driver DDV, and display pads D-PD.

The base substrate BS may provide a base surface on which the electrical elements and the lines of the display panel DP are arranged. The base substrate BS may include a first base area AA1, a bending area BA, and a second base area AA2 divided in the second direction DR2. The bending area BA may extend from the first base area AA1 in the second direction DR2. The second base area AA2 may extend from the bending area BA in the second direction DR2. Thus, the first base area AA1 and the second base area AA2 may be spaced apart from each other with the bending area BA interposed therebetween.

The first base area AA1 may include a display area DA. The display area DA may be an area in which light emitting elements of the pixels PX are arranged. Accordingly, the pixels PX may display the image through the display area DA. The display area DA may correspond to the active area AA (see FIG. 2) of the display module DM (see FIG. 2) and overlap the transmissive area TA (see FIG. 2) of the window WM (see FIG. 2) in a plan view.

The first base area AA1 except for the display area DA, the bending area BA, and the second base area AA2 may be defined as a non-display area NDA. The non-display area NDA may be an area which is adjacent to the display area DA and on which the image is not displayed. The non-display area NDA may surround the display area DA. The scan driver SDV for driving the pixels PX, the emission driver EDV, the data driver DDV, and display pads D-PD electrically connected to the signal lines SL1 to SLm, DL1 to DLn, EL1 to ELm, CSL1, CSL2, and PL may be arranged in the non-display area NDA. The signal lines SL1 to SLm, DL1 to DLn, EL1 to ELm, CSL1, CSL2, and PL electrically connected to the pixels PX may be extended and arranged to the non-display area NDA.

The bending area BA may be an area that is bent about the bending axis extending in the first direction DR1. That is, the bending area BA may be bent toward a rear surface of the display panel DP corresponding to the first base area AA1. The second base area AA2 extending from one side of the bending area BA may overlap the first base area AA1 in a plan view according to bending of the bending area BA. That is, the second base area AA2 may be disposed on the rear surface of the display panel DP corresponding to the first base area AA1.

Widths of the bending area BA and the second base area AA2 in the first direction DR1 may be smaller than a width the first base area AA1. As the width of the bending area BA is smaller than the width of the first base area AA1 in a direction parallel to the bending axis, the bending area BA may be easily bent. However, this is illustrative, at least one of the widths of the bending area BA and the second base area AA2 in the first direction DR1 may be the same as the width of the first base area AA1, and the present disclosure is not limited thereto.

The second base area AA2 may be an area positioned below the first base area AA1 and provided flat by bending the bending area BA. The second base area AA2 may be an area in which signal lines, extending to the display pads D-PD via the bending area BA, among the signal lines SL1 to SLm, DL1 to DLn, EL1 to ELm, CSL1, CSL2, and PL, and the data driver DDV are arranged.

An area in which the display pads D-PD are arranged and an area in which detection pads I-PD (see FIG. 5), which will be described below, are arranged may be classified into a display pad area PD-A and a detection pad area IPD-A. FIG. 4 illustratively illustrates that the display pad area PD-A and the detection pad area IPD-A are divided in the first direction DR1. In an embodiment, for example, the detection pad area IPD-A may be provided adjacent to opposite sides of the second base area AA2 in the first direction DR1, and the display pad area PD-A may be provided in a central portion thereof. However, an embodiment is not necessarily limited thereto, and the arrangement positions of the display pads D-PD and the detection pads I-PD (see FIG. 5) may be variously changed.

Figure 5:
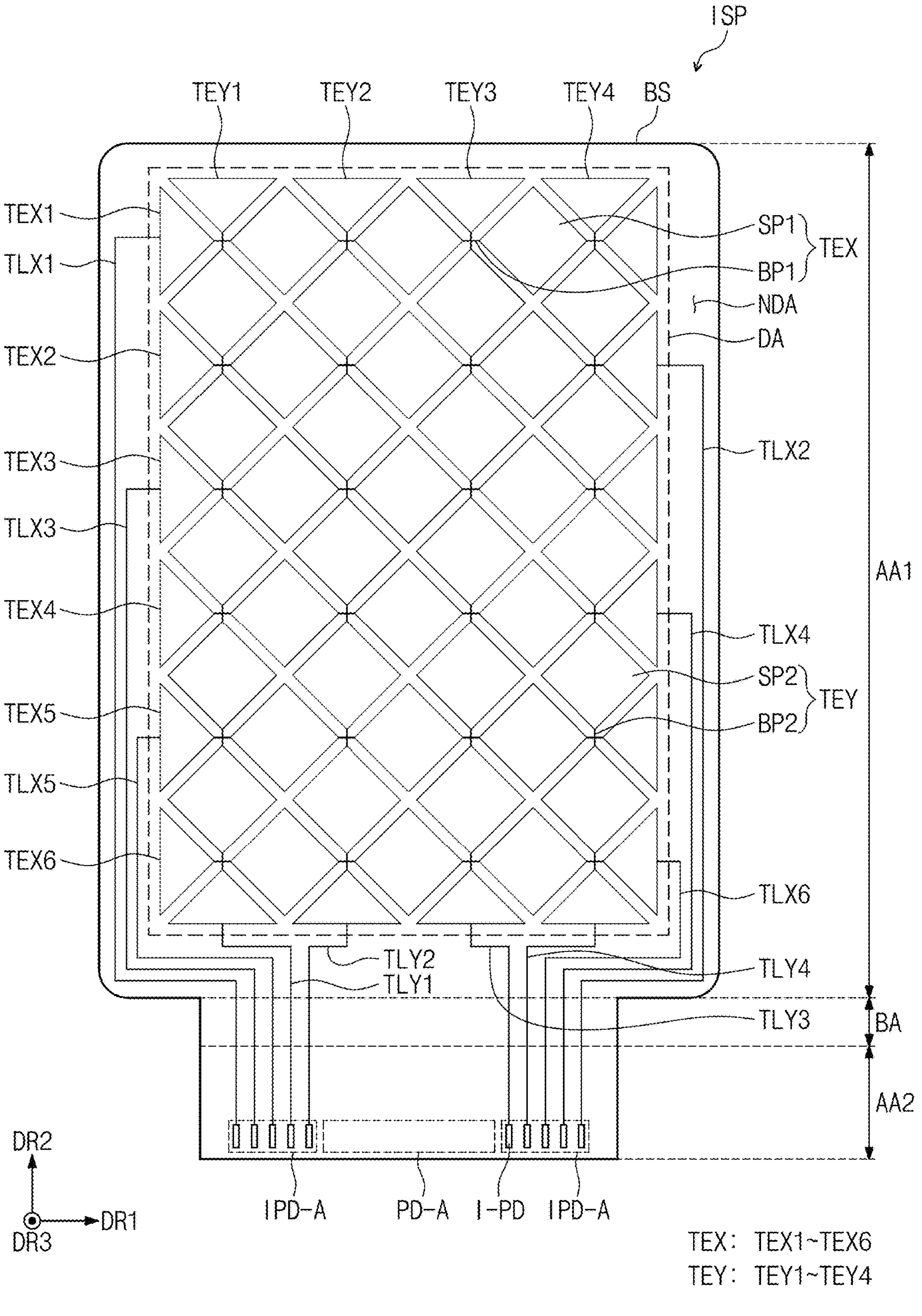
FIG. 5 is a plan view of an input detection unit according to an embodiment of the present disclosure.

The flexible circuit board FCB (see FIG. 2) may be disposed on the second base area AA2 in which the display pads D-PD and the detection pads I-PD (see FIG. 5) are arranged and electrically connected to the display pads D-PD and the detection pads I-PD (see FIG. 5). The flexible circuit board FCB (see FIG. 2) disposed adjacent to a lower end of the second base area AA2 may be positioned on the rear surface of the display panel DP according to the bending of the bending area BA. As the second base area AA2 and the flexible circuit board FCB (see FIG. 2) are positioned below the first base area AA1 on the front surface of the electronic device EA (see FIG. 2), a bezel area of the electronic device EA (see FIG. 2) may be reduced.

Each of the pixels PX may include a pixel driving circuit including transistors (for example, a switching transistor, a driving transistor, or the like) and at least one capacitor and a light emitting element electrically connected to the pixel driving circuit. The pixels PX may generate light in correspondence to electrical signals applied to the pixels PX and display an image through the display area DA. According to an embodiment, some of the pixels PX may include transistors arranged in the non-display area NDA, but the present disclosure is not limited thereto.

The scan driver SDV and the emission driver EDV may be disposed on the non-display area NDA corresponding to the first base area AA1. The data driver DDV may be disposed on the non-display area NDA corresponding to the second base area AA2. In an embodiment, the data driver DDV may be provided in the form of an integrated circuit chip mounted on the non-display area NDA of the display panel DP. However, the present disclosure is not limited thereto, and the data driver DDV may be mounted on the flexible circuit board FCB (see FIG. 2) in another embodiment.

The signal lines SL1 to SLm, DL1 to DLn, EL1 to ELm, CSL1, CSL2, and PL may include the scan lines SL1 to SLm, the data lines DL1 to DLn, the light emission lines EL1 to ELm, the first and second control lines CSL1 and CSL2, and the power line PL. Here, "m" and "n" represent natural numbers.

The data lines DL1 to DLn may be insulated from and intersect the scan lines SL1 to SLm and the light emission lines EL1 to ELm. In an embodiment, for example, the scan lines SL1 to SLm may extend in the first direction DR1 and may be electrically connected to the scan driver SDV. The data lines DL1 to DLn may extend in the second direction DR2 and may be electrically connected to the data driver DDV. The light emission lines EL1 to ELm may extend in the first direction DR1 and may be electrically connected to the emission driver EDV.

The power line PL my include a portion extending in the first direction DR1 and a portion extending in the second direction DR2. A portion of the power line PL extending in the first direction DR1 and a portion of the power line PL extending in the second direction DR2 may be arranged on different layers or integrally arranged on the same layer. The portion of the power line PL extending in the first direction DR1 may be electrically connected to the pixels PX and the portion of the power line PL extending in the second direction DR2. The portion of the power line PL extending in the second direction DR2 may be disposed in the non-display area NDA and may be electrically connected to the display pads D-PD via the bending area BA and the second base area AA2 from the first base area AA1. The power line PL may provide a first voltage to the pixels PX.

The first control line CSL1 may be electrically connected to the scan driver SDV and may extend toward the lower end of the second base area AA2 via the bending area BA. The second control line CSL2 may electrically be connected to the emission driver EDV and may extend toward the lower end of the second base area AA2 via the bending area BA.

The display pads D-PD may be arranged adjacent to the lower end of the second base area AA2. On the second base area AA2, the display pads D-PD may be arranged closer to a lower end of the base substrate BS than the data driver DDV. The display pads D-PD may be arranged spaced apart from each other in the first direction DR1. The power line PL, the first control line CSL1, and the second control line CSL2 may be electrically connected to corresponding display pads D-PD among the display pads D-PD. The data lines DL1 to DLn may be electrically connected to corresponding display pads D-PD among the display pads D-PD through the data driver DDV.

The display pads D-PD may be electrically connected to the flexible circuit board FCB (see FIG. 2) through an anisotropic conductive adhesive layer, and the electrical signal provided by the flexible circuit board FCB (see FIG. 2) may be transmitted to the display panel DP through the display pads D-PD. However, a connection method between the display pads D-PD and the flexible circuit board FCB (see FIG. 2) is not limited thereto.

The scan driver SDV may generate scan signals in response to a scan control signal. The scan signals may be applied to the pixels PX through the scan lines SL1 to SLm. The data driver DDV may generate data voltages corresponding to image signals in response to a data control signal. The data voltages may be applied to the pixels PX through the data lines DL1 to DLn. The emission driver EDV may generate light emission signals in response to a light emission control signal. The light emission signals may be applied to the pixels PX through the light emission lines EL1 to ELm.

The pixels PX may receive the data voltages in response to the scan signals. The pixels PX may generate an image by emitting a light beam having a luminance corresponding to the data voltages in response to the light emission signals. Light emission times of the pixels PX may be controlled by the light emission signals.

FIG. 5 is a plan view of the input detection unit ISP according to an embodiment of the present disclosure. For convenience of description, FIG. 5 briefly illustrates configurations of the input detection unit ISP disposed on the base substrate BS.

In an embodiment, the input detection unit ISP may be driven in a mutual-capacitive type. Referring to FIG. 5, the input detection unit ISP may include first detection electrodes TEX (TEX1 to TEX6), second detection electrodes TEY (TEY1 to TEY4), first detection lines TLX1 to TLX6, second detection lines TLY1 to TLY4, and the detection pads I-PD. However, the present disclosure is not limited thereto, and the input detection unit ISP may be driven in a self-capacitive type in another embodiment.

Each of the first detection electrodes TEX may extend in the first direction DR1, and the first detection electrodes TEX may be arranged in the second direction DR2. FIG. 5 illustratively illustrates six first detection electrodes TEX1 to TEX6. However, the number of the first detection electrodes TEX included in the input detection unit ISP is not limited thereto. One first detection electrode TEX may include first detection patterns SP1 arranged in the first direction DR1 and first connection patterns BP1 connecting the first detection patterns SP1.

Each of the second detection electrodes TEY may extend in the second direction DR2, and the second detection electrodes TEY may be arranged in the first direction DR1. FIG. 5 illustratively illustrates four second detection electrodes TEY1 to TEY4. However, the number of the second detection electrodes TEY included in the input detection unit ISP is not limited thereto. One second detection electrode TEY may include second detection patterns SP2 arranged in the second direction DR2 and second connection patterns BP2 connecting the second detection patterns SP2.

The first detection electrodes TEX and the second detection electrodes TEY may be electrically insulated from each other. The input detection unit ISP may detect the external input through a change in a capacitance between the first detection electrodes TEX and the second detection electrodes TEY. The first detection electrodes TEX and the second detection electrodes TEY may be arranged in an area of the base substrate BS, corresponding to the display area DA. Accordingly, the electronic device EA (see FIG. 1) may display an image through the display area DA, and at the same time, detect the external input applied to the display area DA.

The first detection lines TLX1 to TLX6 may be arranged on the non-display area NDA and electrically connected to the first detection electrodes TEX1 to TEX6, respectively. Some of the first detection lines TLX1 to TLX6 may be arranged on a left side of the non-display area NDA, and the other thereof may be arranged on a right side of the non-display area NDA. In an embodiment, for example, the first detection lines TLX1, TLX3, and TLX5 connected to the first detection electrodes TEX1, TEX3, and TEX5 arranged in odd-numbered rows may be connected to left sides of the first detection electrodes TEX1, TEX3, and TEX5, respectively, and the first detection lines TLX2, TLX4, and TLX6 connected to the first detection electrodes TEX2, TEX4, and TEX6 arranged in even-numbered rows may be connected to right sides of the first detection electrodes TEX2, TEX4, and TEX6, respectively. However, the arrangement of the first detection lines TLX1 to TLX6 is not limited thereto, and all the first detection lines TLX1 to TLX6 may be arranged on the left side of the non-display area NDA or all the first detection lines TLX1 to TLX6 may be arranged on the right side of the non-display area NDA in another embodiment.

Each of the first detection lines TLX1 to TLX6 may extend from the first base area AA1 via the bending area BA toward the second base area AA2. The first detection lines TLX1 to TLX6 may be electrically connected to the detection pads I-PD arranged on the second base area AA2.

The second detection lines TLY1 to TLY4 may be arranged on the non-display area NDA and electrically connected to the second detection electrodes TEY1 to TEY4, respectively. Some of the second detection lines TLY1 to TLY4 may be arranged adjacent to the left side of the non-display area NDA, and the other thereof may be arranged adjacent to the right side of the non-display area NDA. In an embodiment, for example, the second detection lines TLY1 and TLY2 electrically connected to the second detection electrodes TEY1 and TEY2 arranged on a left side in the first direction DR1 among the second detection electrodes TEY1 to TEY4 may be arranged adjacent to a left side of the first base area AA1, and the second detection lines TLY3 and TLY4 electrically connected to the second detection electrodes TEY3 and TEY4 arranged on a right side may be arranged adjacent to a right side of the first base area AA1. However, the arrangement of the second detection lines TLY1 to TLY4 is not limited thereto.

Each of the second detection lines TLY1 to TLY4 may extend from an area adjacent to a lower end of the first base area AA1 via the bending area BA toward the second base area AA2. The second detection lines TLY1 to TLY4 may be electrically connected to the detection pads I-PD arranged on the second base area AA2.

Some of the detection pads I-PD may be arranged in an area adjacent to a left side of the second base area AA2 in the first direction DR1, and the other thereof may be arranged in an area adjacent to a right side of the second base area AA2. In an embodiment, for example, the detection pads I-PD may be divided into two spaced groups with the display pad area PD-A interposed therebetween. However, the arrangement of the detection pads I-PD is not limited thereto.

The detection pads I-PD may be arranged on the same layer as the display pads D-PD (see FIG. 4). The detection pads I-PD may be arranged on a different layer from the first and second detection lines TLX1 to TLX6 and TLY1 to TLY4 and connected through a contact hole. However, the present disclosure is not limited thereto, and the detection pads I-PD may be arranged on a different layer from the display pads D-PD (see FIG. 4) in another embodiment. In another embodiment, for example, the detection pads I-PD may be integrally formed (i.e., monolithic) on the same layer as the first and second detection lines TLX1 to TLX6 and TLY1 to TLY4.

The first and second detection lines TLX1 to TLX6 and TLY1 to TLY4 may be arranged above components of the display panel DP (see FIG. 4) on an area corresponding to the non-display area NDA of the base substrate BS. Accordingly, the first and second detection lines TLX1 to TLX6 and TLY1 to TLY4 may overlap components of the display panel DP (see FIG. 4) on the bending area BA and the second base area AA2.

Figure 6:
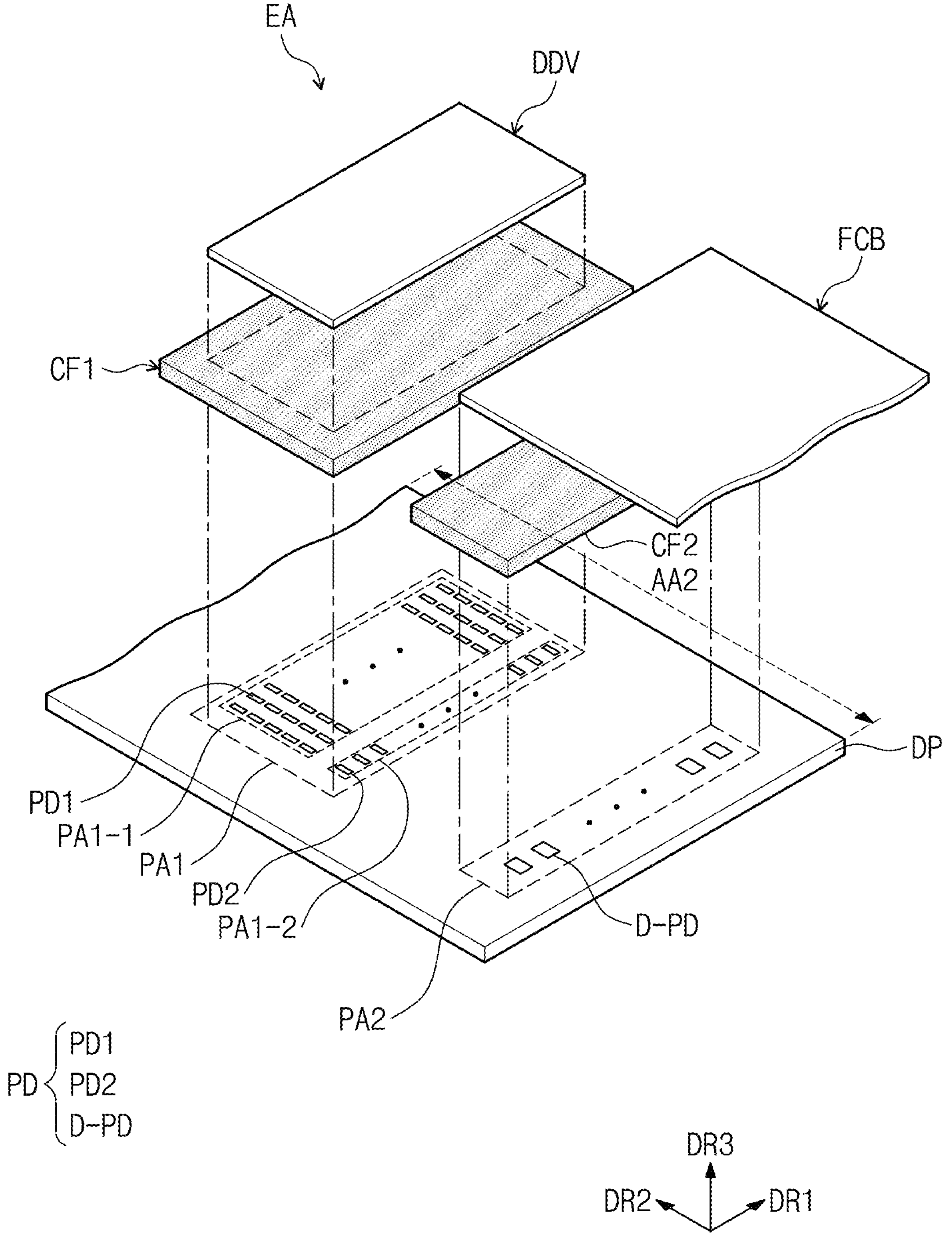
FIG. 6 is a perspective view of the electronic device according to an embodiment of the present disclosure.

FIG. 6 is a perspective view of the electronic device EA according to an embodiment of the present disclosure. FIG. 6 briefly illustrates some components of the electronic device EA disposed to correspond to the second base area AA2.

The second base area AA2 corresponds to a partial area of the non-display area NDA (see FIG. 4). As illustrated in FIG. 6, among the non-display area NDA or the second base area AA2, an area to which the data driver DDV is bonded may be defined as a first pad area PA1, and an area to which the flexible circuit board FCB is bonded may be defined as a second pad area PA2.

The data driver DDV may be bonded to the first pad area PA1 through a first adhesive layer CF1, and the flexible circuit board FCB may be bonded to the second pad area PA2 through a second adhesive layer CF2. Each of the first adhesive layer CF1 and the second adhesive layer CF2 may be an anisotropic conductive film. In an embodiment, for example, each of the first adhesive layer CF1 and the second adhesive layer CF2 may include an adhesive resin and conductive particles dispersed in the adhesive resin. Alternatively, each of the first adhesive layer CF1 and the second adhesive layer CF2 may be a non-conductive film. In an embodiment, for example, each of the first adhesive layer CF1 and the second adhesive layer CF2 may be an adhesive resin not including conductive particles. A detailed description related to the first adhesive layer CF1 and the second adhesive layer CF2 will be made below.

However, the present disclosure is not limited thereto, and in another embodiment, any one of the first adhesive layer CF1 and the second adhesive layer CF2 may be omitted. In an embodiment, for example, the data driver DDV and the flexible circuit board FCB may be bonded to the first pad area PA1 and the second pad area PA2 by ultrasonic bonding.

The display panel DP may include a plurality of pads PD. The plurality of pads PD may include first signal pads PD1, second signal pads PD2, and the display pads D-PD. The first signal pads PD1, the second signal pads PD2, and the display pads D-PD may be pads arranged on a signal transmission path.

The first signal pads PD1 may be input pads that are arranged to correspond to an output pad of the data driver DDV and receive a signal from the data driver DDV. The second signal pads PD2 may be output pads that are arranged to correspond to an input pad of the data driver DDV and output a signal to the data driver DDV. The display pads D-PD may be panel input pads that receive a signal from the flexible circuit board FCB.

The first signal pads PD1 may be electrically connected to the pixels PX (see FIG. 4) of the display panel DP through the signal lines and transmit or receive a signal to or from the pixels PX (see FIG. 4). The second signal pads PD2 may be electrically connected to corresponding display pads D-PD among the display pads D-PD through a signal wiring line, and the display pads D-PD and the second signal pads PD2 electrically connected to each other may transmit or receive a signal.

The first pad area PA1 may include a first sub-pad area PA1-1 and a second sub-pad area PA1-2. The first sub-pad area PA1-1 may be defined as an area in which the first signal pads PD1 are arranged. The second sub-pad area PA1-2 may be defined as an area in which the second signal pads PD2 are arranged.

The first signal pads PD1 may be arranged inside the first sub-pad area PA1-1 in the first direction DR1 and the second direction DR2. The first signal pads PD1 arranged in the first direction DR1 among the first signal pads PD1 may be defined as pad rows. FIG. 6 illustratively illustrates that five pad rows are arranged in the second direction DR2. The arrangement of the first signal pads PD1 is not limited as long as at least two pad rows are arranged in the second direction DR2.

The second signal pads PD2 may be arranged inside the second sub-pad area PA1-2 in the first direction DR1. The second signal pads PD2 may be arranged in one pad row. However, the arrangement of the second signal pads PD2 is not limited to thereto.

Figure 7:
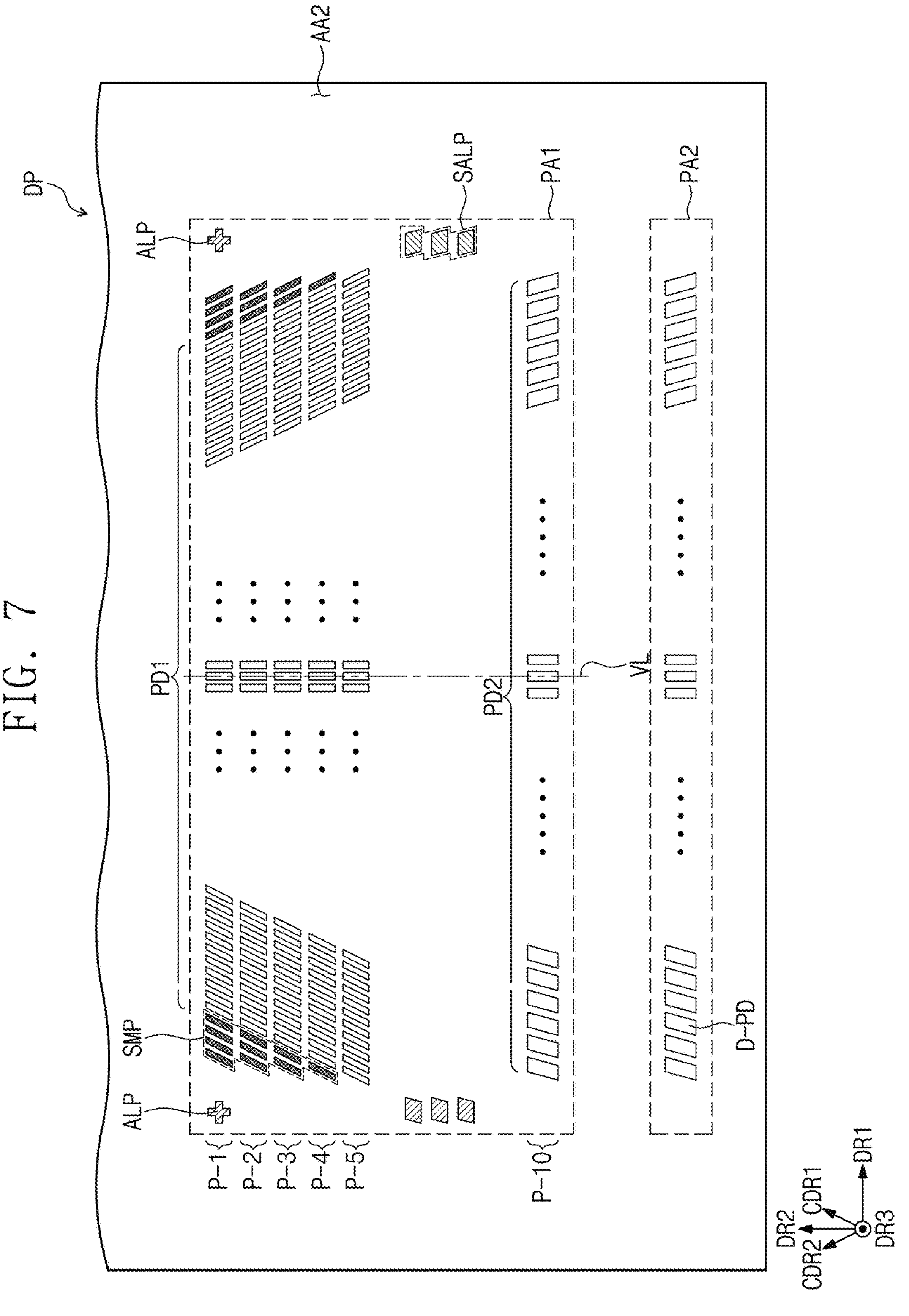
FIG. 7 is a plan view of the display panel according to an embodiment of the present disclosure.

FIG. 7 is a plan view of the display panel DP according to an embodiment of the present disclosure. FIG. 7 is a plan view of a portion of the display panel DP corresponding to the second base area AA2. The above description may be applied to the respective components.

FIG. 7 enlargedly illustrates the first and second pad areas PA1 and PA2 according to an embodiment. The data driver DDV (see FIG. 6) may be bonded to the first pad area PA1, and the flexible circuit board FCB (see FIG. 6) may be bonded to the second pad area PA2.

Referring to FIG. 7, the first signal pads PD1 and the second signal pads PD2 may be arranged in the first pad area PA1. The first signal pads PD1 may be arranged in five pad rows P-1 to P-5 inside an area adjacent to an upper portion of the first pad area PA1. The five pad rows P-1 to P-5 may be defined as first to fifth input pad rows P-1 to P-5. The second signal pads PD2 may be arranged in one pad row P-10 inside an area adjacent to a lower portion of the first pad area PA1. The one pad row P-10 may be defined as a first output pad row P-10.

Among the first signal pads PD1, first central pads arranged in a center in the first direction DR1 may be arranged on a reference line VL. The first central pads may extend in the second direction DR2. The first signal pads PD1 arranged on a left side and a right side of the reference line VL among the first signal pads PD1 may extend to have a predetermined slope with respect to the reference line VL. Some of the first signal pads PD1 arranged on the left side of the reference line VL may extend in a first oblique direction CDR1. The first signal pads PD1 arranged on the left side may extend to form an acute angle in a clockwise direction with respect to the reference line VL. Some of the first signal pads PD1 arranged on the right side of the reference line VL may extend in a second oblique direction CDR2. The first signal pads PD1 arranged on the right side may extend to form an acute angle in a counterclockwise direction with respect to the reference line VL.

Among the second signal pads PD2, a second central pad arranged in a center in the first direction DR1 may be arranged on the reference line VL. The second central pad may extend in the second direction DR2. The second signal pads PD2 arranged on the left side and the right side of the reference line VL among the second signal pads PD2 may extend to have a predetermined slope with respect to the reference line VL. Some of the second signal pads PD2 arranged on the left side of the reference line VL may extend to have an acute angle in a clockwise direction with respect to the reference line VL, and some of the second signal pads PD2 arranged on the right side of the reference line VL may extend to have an acute angle in a counterclockwise direction with respect to the reference line VL.

The display panel DP may further include dummy pads SMP. The dummy pads SMP may be arranged inside the first pad area PA1. The dummy pads SMP may be electrically isolated pads and may be arranged to supplement areas between an edge of the second base area AA2 and the first signal pads PD1.

The dummy pads SMP may be arranged outside the outermost first signal pads PD1 in at least one row of the first to fifth input pad rows P-1 to P-5. The dummy pads SMP may be arranged adjacent to a left side and a right side of the first pad area PA1. FIG. 6 illustratively illustrates the dummy pads SMP arranged outside the first to fourth input pad rows P-1 to P-4 among the first to fifth input pad rows P-1 to P-5, but the arrangement of the dummy pads SMP is not limited thereto.

The dummy pads SMP may extend in a direction parallel to a direction in which the first signal pad PD1 disposed adjacent to the dummy pads SMP extends. The dummy pads SMP arranged adjacent to one pad row among the dummy pads SMP may be arranged side by side together with the first signal pads PD1 of the one pad row in the first direction DR1.

The display panel DP may further include an alignment pad ALP. The alignment pad ALP may be disposed in the first pad area PA1. The alignment pad ALP may be provided as a plurality of alignment pads ALP, and the alignment pads ALP may be arranged adjacent to left and right corners of the first pad area PA1.

The alignment pad ALP may be an identification mark or alignment mark for aligning the data driver DDV (see FIG. 6) and the first pad area PA1 of the display panel DP in a process of bonding the data driver DDV (see FIG. 6) onto the first pad area PA1 of the display panel DP. FIG. 7 illustratively illustrates the cross-shaped alignment pad ALP, but the shape of the alignment pad ALP is not limited to any one as long as the data driver DDV (see FIG. 6) and the display panel DP are aligned, and the alignment pad ALP may have a circular shape or polygonal shape.

In an embodiment, the dummy pads SMP and the alignment pad ALP may be formed through the same process, and the dummy pads SMP and the alignment pad ALP may include the same material. In an embodiment, at least one of the dummy pads SMP and the alignment pad ALP may include the same material as the material of the first signal pads PD1. At least one of the dummy pads SMP and the alignment pad ALP may be formed through the same process as the producing process of the first signal pads PD1.

The display panel DP may further include a sub-alignment pad SALP. The sub-alignment pad SALP may be disposed in the first pad area PA1. The sub-alignment pad SALP is provided as a plurality of sub-alignment pads SALP, some of the sub-alignment pads SALP may be arranged adjacent to the left side of the first pad area PA1, and the other thereof may be arranged adjacent to the right side of the first pad area PA1.

The sub-alignment pad SALP may be an identification mark or alignment mark for aligning the data driver DDV (see FIG. 6) and the display panel DP or inspecting whether the alignment of the data driver DDV (see FIG. 6) and the display panel DP is proper in a process of bonding the data driver DDV (see FIG. 6) onto the first pad area PA1 of the display panel DP. FIG. 7 illustratively illustrates the quadrangular sub-alignment pad SALP, but the shape of the sub-alignment pad SALP is not limited to any one as long as the alignment between the data driver DDV (see FIG. 6) and the display panel DP may be identified, and the sub-alignment pad SALP may have a circular shape or polygonal shape.

Figure 8:
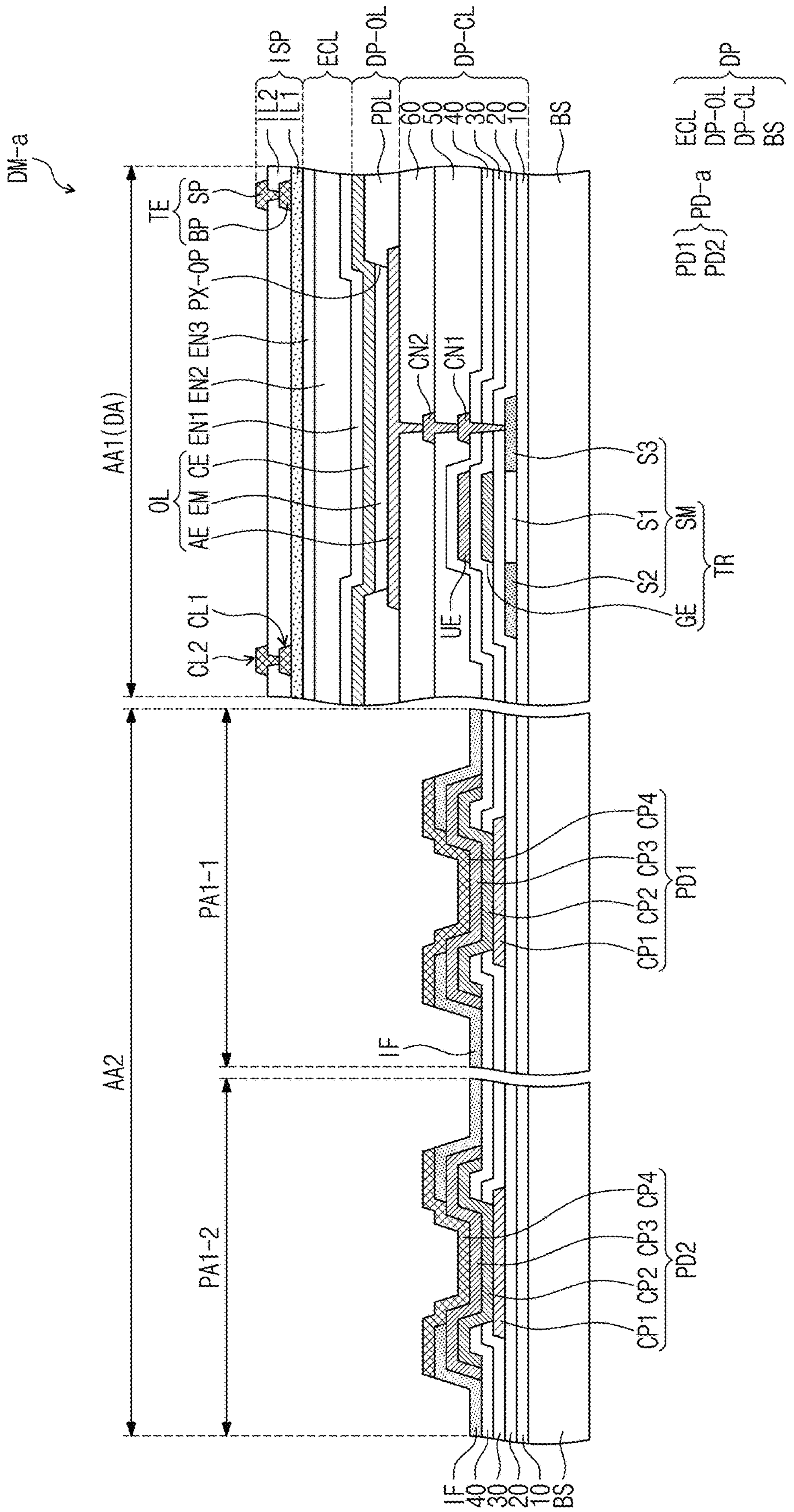
FIG. 8 is a cross-sectional view of a display module according to an embodiment of the present disclosure.

FIG. 8 is a cross-sectional view of a display module DM-a according to an embodiment of the present disclosure. FIG. 8 illustratively illustrates a cross section of the pixel PX (see FIG. 4) disposed in the first base area AA1 and the first and second signal pads PD1 and PD2 arranged in the second base area AA2.

Referring to FIG. 8, the display module DM-a may include the display panel DP and the input detection unit ISP disposed on the display panel DP. The above description may be equally applied to respective components.

Referring to FIG. 8, the display panel DP may include the base substrate BS, the circuit layer DP-CL, the display element layer DP-OL, and the encapsulation Layer ECL.

The base substrate BS may provide the base surface which has insulating properties and on which components of the display module DM-a are arranged. The base substrate BS may have flexibility to be bendable. As described above, the base substrate BS may include the first base area AA1, the bending area BA (see FIG. 4), and the second base area AA2, and the bending area BA (see FIG. 4) of the base substrate BS may be bent at a predetermined curvature.

The circuit layer DP-CL may include insulating layers 10 to 60 arranged on the base substrate BS, a transistor TR of the pixel PX (see FIG. 4), an upper electrode UE, and connection electrodes CN1 and CN2. The insulating layers 10 to 60 may include first to sixth insulating layers 10 to 60 that are sequentially laminated on the base substrate BS in a thickness direction. However, an embodiment of the insulating layers 10 to 60 included in the circuit layer DP-CL is not limited thereto and may be changed according to a configuration of the circuit layer DP-CL or a manufacturing process.

The first insulating layer 10 may be disposed on the base substrate BS. The first insulating layer 10 may be provided as a barrier layer and/or a buffer layer that prevents foreign substances from being introduced from the outside. The first insulating layer 10 may improve a coupling force between the base substrate BS and a semiconductor pattern SM and/or a conductive pattern of the circuit layer DP-CL. The first insulating layer 10 may include at least one of a silicon oxide layer and a silicon nitride layer. In an embodiment, the first insulating layer 10 may include silicon oxide layers and silicon nitride layers that are alternately laminated.

The pixel PX (see FIG. 4) may be disposed on the base substrate BS. The pixel PX (see FIG. 4) may be disposed to correspond to the display area DA of the first base area AA1. The pixel PX (see FIG. 4) may include the transistor TR and a light emitting element OL.

The transistor TR may include the semiconductor pattern SM and a gate electrode GE. The semiconductor pattern SM may be disposed on the first insulating layer 10. The semiconductor pattern SM may include a channel S1, a source S2, and a drain S3. The semiconductor pattern SM may include a silicon semiconductor, and may include a single-crystal silicon semiconductor, a poly-silicon semiconductor, or an amorphous silicon semiconductor. The present disclosure is not limited thereto, and the semiconductor pattern SM may also include an oxide semiconductor in another embodiment. The semiconductor pattern SM according to an embodiment of the present disclosure may be formed of various materials as long as the materials have semiconductor properties, and is not limited to an embodiment.

The semiconductor pattern SM may include a plurality of areas having different electrical properties according to whether the areas are doped or reduced. In an embodiment, for example, the semiconductor pattern SM may include an area having high conductivity due to doping or reduction of a metal oxide, and the area having high conductivity may serve as an electrode of the transistor TR or a signal wiring line. This may correspond to the source S2 and the drain S3 of the transistor TR. The semiconductor pattern SM may include an area that is not doped and thus has relatively low conductivity, which may correspond to the channel S1 (or an active area) of the transistor TR.

The second insulating layer 20 may be disposed on the first insulating layer 10 to cover the semiconductor pattern SM. The gate electrode GE may be disposed on the second insulating layer 20. The second insulating layer 20 may be disposed between the semiconductor pattern SM and the gate electrode GE of the transistor TR. The gate electrode GE may overlap the channel S1 of the semiconductor pattern SM in a plan view. The gate electrode GE may function as a mask in a process of doping the semiconductor pattern SM. The gate electrode GE may include molybdenum (Mo) having heat resistance, an alloy containing molybdenum, titanium (Ti), an alloy containing titanium, or the like, but the present disclosure is not limited thereto.

A structure of the transistor TR illustrated in FIG. 8 is illustrative, and the source S2 or the drain S3 of the transistor TR may be electrodes formed independently from the semiconductor pattern SM. In this case, the source S2 and the drain S3 may be in contact with the semiconductor pattern SM or connected to the semiconductor pattern SM through the insulating layers. Further, the gate electrode GE may be disposed below the semiconductor pattern SM. The transistor TR according to an embodiment of the present disclosure may have various structures, and is not limited to an embodiment.

the second insulating layer 20 and the third to sixth insulating layers 30 to 60, which will be described below, may include at least one of an inorganic layer and an organic layer. In an embodiment, for example, the inorganic layer may include at least one of aluminum oxide, titanium oxide, silicon oxide, silicon oxynitride, zirconium oxide, and hafnium oxide. The organic layer may include at least one of acrylic resin, methacrylic resin, polyisoprene, vinyl resin, epoxy resin, urethane resin, cellulose resin, siloxane resin, polyamide resin, and perylene resin.

The third insulating layer 30 may be disposed on the second insulating layer 20 to cover the gate electrode GE. The upper electrode UE may be disposed on the third insulating layer 30. The upper electrode UE may overlap the gate electrode GE in a plan view, and the gate electrode GE and the upper electrode UE overlapping each other in a plan view may form a capacitor.

The fourth insulating layer 40 may be disposed on the third insulating layer 30 to cover the upper electrode UE. The connection electrodes CN1 and CN2 may include the first connection electrode CN1 and the second connection electrode CN2. The first connection electrode CN1 may be disposed on the fourth insulating layer 40. The fifth insulating layer 50 may be disposed on the fourth insulating layer 40 to cover the first connection electrode CN1. The second connection electrode CN2 may be disposed on the fifth insulating layer 50. The sixth insulating layer 60 may be disposed on the fifth insulating layer 50 to cover the second connection electrode CN2. In an embodiment, at least one of the fifth insulating layer 50 and the sixth insulating layer 60 may include an inorganic layer, cover a step between components arranged therebelow, and provide a flat upper surface.

The first connection electrode CN1 may be electrically connected to the semiconductor pattern SM through a contact hole passing through the second to fourth insulating layers 20 to 40. The second connection electrode CN2 may be electrically connected to the first connection electrode CN1 through a contact hole passing through the fifth insulating layer 50.

Each of the first connection electrode CN1 and the second connection electrode CN2 may include a conductive material. Each of the first connection electrode CN1 and the second connection electrode CN2 may include gold, silver, copper, aluminum, platinum, molybdenum, titanium, alloys thereof, or the like. At least one of the first connection electrode CN1 and the second connection electrode CN2 may include multi-layered conductive layers. In an embodiment, for example, at least one of the first connection electrode CN1 and the second connection electrode CN2 may have a three-layered structure of titanium/aluminum/titanium. However, an embodiment is not limited thereto.

According to an embodiment of the circuit layer DP-CL, at least one of the first connection electrode CN1 and the second connection electrode CN2 may be omitted. Alternately, according to an embodiment of the circuit layer DP-CL, an additional connection electrode that connects the transistor TR and the light emitting element OL may be further disposed. An electrical connection method between the light emitting element OL and the transistor TR may be variously changed depending on the number of insulating layers arranged between the light emitting element OL and the transistor TR, and is not limited to any one embodiment.

The display element layer DP-OL may include the light emitting element OL and a pixel defining film PDL. The light emitting element OL and the pixel defining film PDL may be arranged on the sixth insulating layer 60. The light emitting element OL may include a first electrode AE, a light emission layer EM, and a second electrode CE.

The first electrode AE may be electrically connected to the second connection electrode CN2 through a contact hole passing through the sixth insulating layer 60. The first electrode AE may be electrically connected to the transistor TR through the first and second connection electrodes CN1 and CN2.

A pixel opening PX-OP at least partially exposing the first electrode AE may be defined by the pixel defining film PDL. An area of the first electrode AE exposed from the pixel defining film PDL may correspond to a light emission area. The pixel defining film PDL may include an inorganic layer, an organic layer, and a composite material layer. According to an embodiment, the pixel defining film PDL may further include a black pigment or a black dye.

The light emission layer EM may be disposed on the first electrode AE. The light emission layer EM may provide a light beam having a predetermined color. The light emission layer EM may be disposed to correspond to the pixel opening PX-OP defined by the pixel defining film PDL. The light emitting element OL and the pixel opening PX-OP may be provided in plurality, and the light emission layers EM of the light emitting elements OL are arranged to correspond to the pixel openings PX-OP, respectively, and provided in the form of patterns spaced apart from each other. However, the present disclosure is not limited thereto, and the light emission layers EM of the light emitting elements OL may be formed as an integral common layer in another embodiment.

The second electrode CE may be disposed on the light emission layer EM and the pixel defining film PDL. The second electrode CE may be provided as a common electrode commonly disposed in the pixels PX (see FIG. 4).

The light emitting element OL may further include at least one of a hole control area disposed between the first electrode AE and the light emission layer EM and an electron control area disposed between the light emission layer EM and the second electrode CE. The hole control area may include at least one of a hole generation layer, a hole transport layer, and an electron blocking layer, and the electron control area may include at least one of an electron generation layer, an electron transport layer, and a hole blocking layer.

The encapsulation layer ECL may be disposed on the display element layer DP-OL. The encapsulation layer ECL may be disposed on the light emitting element OL and the pixel defining film PDL to seal the light emitting element OL. The encapsulation layer ECL may include at least one of an inorganic film and an organic film. In an embodiment, the encapsulation layer ECL may include a first inorganic film EN1, a second inorganic film EN3, and an organic film EN2 disposed between the first and second inorganic films EN1 and EN3. However, a configuration of the encapsulation layer ECL is not limited thereto as long as the encapsulation layer ECL may seal the light emitting element OL.

The first inorganic film EN1 may be disposed on the second electrode CE, and the organic film EN2 and the second inorganic film EN3 may be sequentially arranged on the first inorganic film EN1 in a thickness direction of the display panel DP. The first and second inorganic films EN1 and EN3 may protect the light emitting element OL from moisture or oxygen introduced from the outside. In an embodiment, for example, each of the first and second inorganic films EN1 and EN3 may include at least one of silicon nitride, silicon oxynitride, silicon oxide, titanium oxide, and aluminum oxide. However, the materials of the first and second inorganic films EN1 and EN3 are not limited to the above example. The organic film EN2 may prevent foreign substances from being introduced into the light emitting element OL and cover steps of components arranged below the organic film EN2. In an embodiment, for example, the organic film EN2 may include an acryl-based organic material. However, the material of the organic film EN2 is not limited to the above example.

The input detection unit ISP may be disposed on the display panel DP. The input detection unit ISP may include the base layer IL1, the first detection insulating layer IL2, the first detection conductive layer CL1, and the second detection conductive layer CL2. As illustrated in FIG. 3, the input detection unit ISP may further include the second detection insulating layer IL3 (see FIG. 3). The above description may be equally applied to respective components.

The base layer IL1 may be in contact with the uppermost layer of the encapsulation layer ECL. In an embodiment, for example, the base layer IL1 may be in contact with the second inorganic film EN3 of the encapsulation layer ECL. The base layer IL1 of the input detection unit ISP may be directly disposed on the base surface provided by the encapsulation layer ECL. However, the present disclosure is not limited thereto, and according to another embodiment, the base layer IL1 may be omitted. In this case, the first detection conductive layer CL1 of the input detection unit ISP may be in contact with the encapsulation layer ECL.

The first detection conductive layer CL1 may be disposed on the base layer IL1, and the second detection conductive layer CL2 may be disposed on the first detection insulating layer IL2. The first detection conductive layer CL1 and the second detection conductive layer CL2 may constitute a detection electrode TE. The detection electrode TE may correspond to any one of the first and second detection electrodes TEX and TEY (see FIG. 5). In an embodiment, for example, the first detection conductive layer CL1 may include a connection pattern BP of the detection electrode TE, and the second detection conductive layer CL2 may include a detection pattern SP of the detection electrode TE. However, the present disclosure is not limited thereto, the first detection conductive layer CL1 may include the detection pattern SP, and the second detection conductive layer CL2 may include the connection pattern BP in another embodiment.

The connection pattern BP may correspond to the first connection pattern BP1 (see FIG. 5) or the second connection pattern BP2 (see FIG. 5), and the detection pattern SP may correspond to the first detection pattern SP1 (see FIG. 5) or the second detection pattern SP2 (see FIG. 5). The connection pattern BP may be disposed on a different layer from the detection pattern SP and connected through a contact hole passing through the first detection insulating layer IL2. However, the present disclosure is not limited thereto, and the connection pattern BP and the detection pattern SP may be arranged on the same layer and integrally formed in another embodiment.

The detection electrode TE may be a mesh-shaped pattern and may be disposed to correspond to an area in which the pixel defining film PDL is disposed. However, the present disclosure is not limited thereto, and the detection electrode TE may be provided as a single pattern overlapping the light emitting element OL in a plan view in another embodiment. In this case, the detection electrode TE may include a transparent conductive material.

The first insulating layer 10 and the second insulating layer 20 may extend from the first base area AA1 on the base substrate BS and may be disposed on the second base area AA2. The first signal pad PD1 and the second signal pad PD2 may be arranged on the second insulating layer 20. The first signal pad PD1 may be disposed in the first sub-pad area PA1-1, and the second signal pad PD2 may be disposed in the second sub-pad area PA1-2. The first signal pad PD1 may be disposed closer to the display area DA inside the first base area AA1 than the second signal pad PD2.

Each of the first and second signal pads PD1 and PD2 may include a plurality of conductive patterns CP1, CP2, CP3, and CP4 arranged in a thickness direction. The first conductive patterns CP1 of the first signal pad PD1 and the second signal pad PD2 may be arranged on the second insulating layer 20.

The first conductive patterns CP1 of the first signal pad PD1 and the second signal pad PD2 may be formed through the same process as the producing process of the gate electrode GE of the transistor TR. In an embodiment, for example, after a conductive layer is formed on the second insulating layer 20 through a deposition process such as sputtering or chemical vapor deposition, the conductive layer may be patterned to form the first conductive patterns CP1 of the first and second signal pads PD1 and PD2 and the gate electrode GE. The first conductive patterns CP1 of the first and second signal pads PD1 and PD2 may be arranged on the same layer as the gate electrode GE of the transistor TR and include the same material.

The third insulating layer 30 and the fourth insulating layer 40 may extend from the first base area AA1 and may be arranged on the second base area AA2. Through-holes exposing upper surfaces of the first conductive patterns CP1 of the first signal pad PD1 and the second signal pad PD2 may be defined in the third insulating layer 30 and the fourth insulating layer 40. The third insulating layer 30 and the fourth insulating layer 40 may be formed by sequentially depositing insulating layers on the first base area AA1 and the second base area AA2 and then performing etching so that portions of the upper surfaces of the first conductive patterns CP1 of the first and second signal pads PD1 and PD2 are exposed.

As illustrated in FIG. 8, at least some of the insulating layers arranged inside the first base area AA1 may be arranged on the second base area AA2, and a laminate structure of the insulating layers arranged in the second base area AA2 is not particularly limited to the illustration.

The second conductive patterns CP2 of the first signal pad PD1 and the second signal pad PD2 may be arranged on the exposed upper surfaces of the first conductive patterns CP1. The second conductive patterns CP2 may be in contact with the first conductive patterns CP1, respectively. Portions of the second conductive patterns CP2 may be arranged on the fourth insulating layer 40. In an embodiment, for example, the portions of the second conductive patterns CP2 may be arranged on the fourth insulating layer 40 while covering inner surfaces of the third and fourth insulating layers 30 and 40, which are exposed by the through-holes.

The second conductive patterns CP2 of the first signal pad PD1 and the second signal pad PD2 may be formed through the same process as the producing process of any one of conductive electrodes in the circuit layer DP-CL. In an embodiment, for example, the second conductive patterns CP2 of the first signal pad PD1 and the second signal pad PD2 may be formed through the same process as the producing process of the first connection electrode CN1. After a conductive layer is formed on the fourth insulating layer 40 through the deposition process such as sputtering or chemical vapor deposition, the conductive layer may be patterned to form the second conductive patterns CP2 of the first and second signal pads PD1 and PD2 and the first connection electrode CN1. The second conductive patterns CP2 of the first and second signal pads PD1 and PD2 may be arranged on the same layer as the first connection electrode CN1 and include the same material.

The third conductive patterns CP3 of the first signal pad PD1 and the second signal pad PD2 may be arranged on the second conductive patterns CP2, respectively. The third conductive patterns CP3 may be in contact with the second conductive patterns CP2, respectively. The third conductive patterns CP3 of the first signal pad PD1 and the second signal pad PD2 may be formed through the same process as the producing process of any one of the conductive electrodes in the circuit layer DP-CL. In an embodiment, for example, the third conductive patterns CP3 of the first signal pad PD1 and the second signal pad PD2 may be formed through the same process as the producing process of the second connection electrode CN2. The fifth insulating layer 50 disposed below the second connection electrode CN2 may be open to correspond to an area in which the first and second signal pads PD1 and PD2 are arranged. That is, the fifth insulating layer 50 may not be disposed on the second conductive patterns CP2 of the first and second signal pads PD1 and PD2, and a portion of a conductive layer deposited on the fifth insulating layer 50 may be in contact with the second conductive patterns CP2. After a conductive layer is formed on the fifth insulating layer 50 through the deposition process such as sputtering or chemical vapor deposition, the conductive layer may be patterned to form the third conductive patterns CP3 of the first and second signal pads PD1 and PD2 and the second connection electrode CN2. The third conductive patterns CP3 may be disposed on the same layer as the layer of the second connection electrode CN2 and include the same material.

The base layer IL1 of the input detection unit ISP may extend from the first base area AA1 and may be disposed on the second base area AA2. The base layer IL1 disposed on the second base area AA2 may be defined as an insulating film IF. That is, the base layer ILL disposed on the first base area AA1 and the insulating film IF disposed on the second base area AA2 may be an integral insulating film. However, an embodiment is not limited thereto, and both the base layer IL1 and the first detection insulating layer IL2 of the input detection unit ISP may extend from the first base area AA1 and may be arranged on the second base area AA2 in another embodiment. In this case, the base layer IL1 and the first detection insulating layer IL2 laminated on the second base area AA2 may correspond to the insulating film IF.

The insulating film IF may be disposed on the first sub-pad area PA1-1 and the second sub-pad area PA1-2. The insulating film IF may be formed simultaneously with a process of forming the insulating layer (for example, the base layer IL1 or the first detection insulating layer IL2) included in the input detection unit ISP. In an embodiment, for example, after the insulating layer is deposited on the first and second base areas AA1 and AA2 through the deposition process such as the chemical vapor deposition, the insulating layer may be etched or patterned to form the base layer IL1 (or the first detection insulating layer IL2) and the insulating film IF.

The insulating film IF may include an inorganic material, and may prevent inflow of moisture or oxygen. In an embodiment, for example, the insulating film IF may include at least one of aluminum oxide, titanium oxide, silicon oxide, silicon oxynitride, zirconium oxide, and hafnium oxide. However, the material of the insulating film IF is not limited to the above example.

A plurality of openings may be defined in the insulating film IF. Upper surfaces of the third conductive patterns CP3 may be exposed by the openings of the insulating film IF.

The fourth conductive patterns CP4 of the first signal pad PD1 and the second signal pad PD2 may be arranged on the upper surfaces of the third conductive patterns CP3, which are exposed from the insulating film IF. The fourth conductive patterns CP4 may be in contact with the third conductive patterns CP3. The fourth conductive patterns CP4 of the first signal pad PD1 and the second signal pad PD2 may extend from the upper surfaces of the third conductive patterns CP3 exposed from the insulating film IF and may be arranged on a portion of the insulating film IF. However, an embodiment is not necessarily limited thereto.

The fourth conductive patterns CP4 of the first signal pad PD1 and the second signal pad PD2 may be formed through the same process as the producing process of any one of the conductive layers of the input detection unit ISP. In an embodiment, for example, the fourth conductive patterns CP4 of the first signal pad PD1 and the second signal pad PD2 may be formed through the same process as the producing process of the first detection conductive layer CL1 or the second detection conductive layer CL2. As an example, after the base layer IL1 and the insulating film IF are formed, the conductive layer is formed thereon through the deposition process such as sputtering or chemical vapor deposition. Thereafter, the conductive layer may be patterned to form the first detection conductive layer CL1 and the fourth conductive patterns CP4 of the first and second signal pads PD1 and PD2. The fourth conductive patterns CP4 may include the same material as the material of the first detection conductive layer CL1 or the second detection conductive layer CL2.

Figure 9:
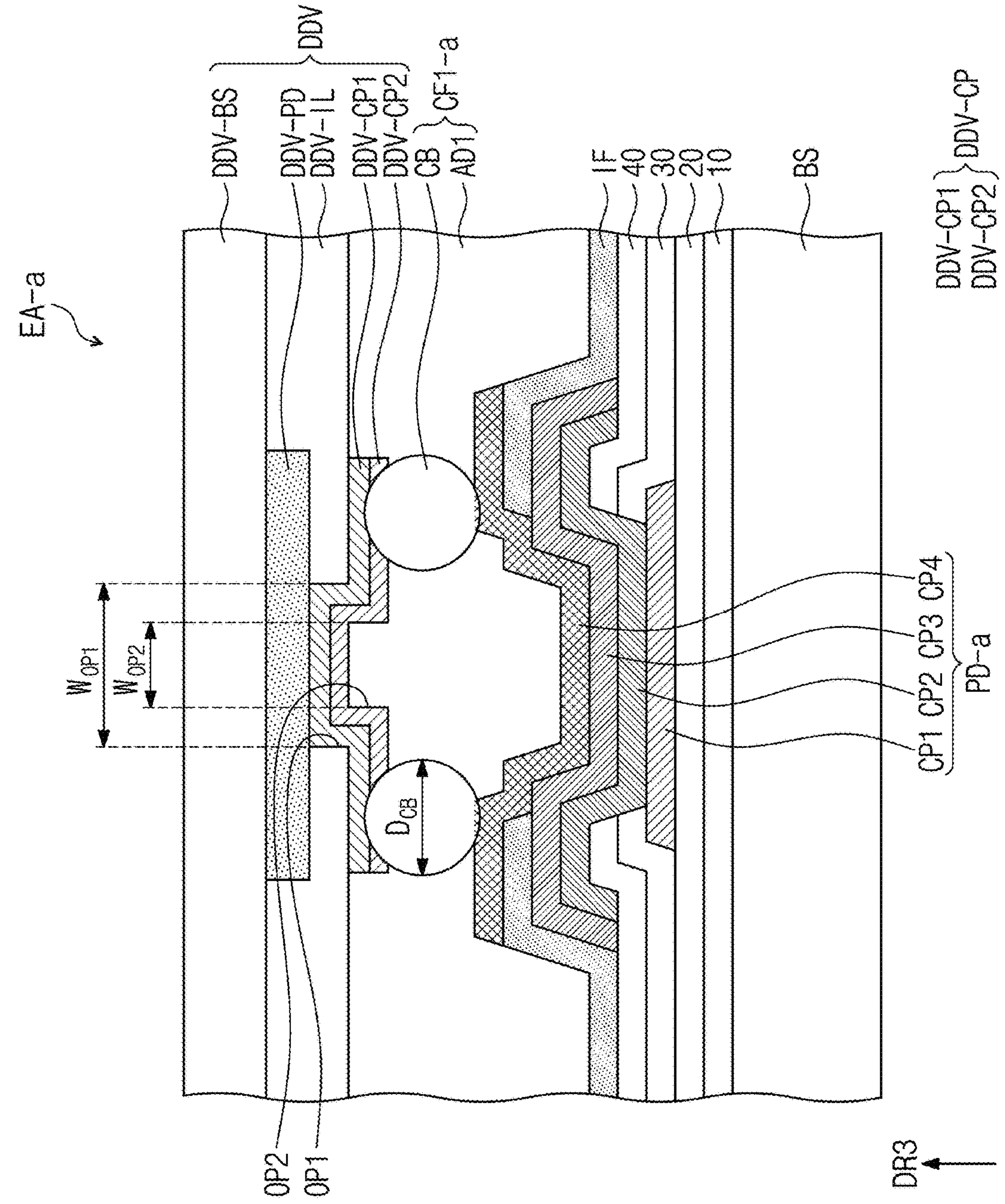
FIG. 9 is a cross-sectional view of the electronic device according to an embodiment of the present disclosure.

FIG. 9 is a cross-sectional view of an electronic device EA-a according to an embodiment of the present disclosure. FIG. 9 illustratively illustrates a cross section of the electronic device EA-a in which the data driver DDV is bonded onto the display panel DP illustrated in FIG. 8. The above description may be equally applied to components of the display panel DP illustrated in FIG. 9, and the same description will be omitted below.

FIG. 9 is a cross section corresponding to the first sub-pad area PA1-1 and the second sub-pad area PA1-2 of the second base area AA2 of FIG. 8. That is, a signal pad PD-a of FIG. 9 may correspond to the first and second signal pads PD1 and PD2 of FIG. 8.

Referring to FIG. 9, the electronic device EA-a may include an adhesive layer CF1-*a* disposed between the display panel DP and the data driver DDV. The adhesive layer CF1-*a* of FIG. 9 may correspond to a detailed illustration of an embodiment of the first adhesive layer CF1 of FIG. 6.

The data driver DDV may include a base layer DDV-BS in which a circuit signal pad DDV-PD is disposed, the circuit signal pad DDV-PD, a conductive layer DDV-CP electrically connected to the circuit signal pad DDV-PD, and an insulating layer DDV-IL.

The circuit signal pad DDV-PD may be an output pad that is disposed to correspond to the first signal pad PD1 (see FIG. 6) and outputs a signal to the first signal pad PD1 (see FIG. 6) and an input pad that is disposed to correspond to the second signal pad PD2 (see FIG. 6) and receives a signal from the second signal pad PD2 (see FIG. 6). The circuit signal pad DDV-PD may include aluminum (Al).

The insulating layer DDV-IL may be disposed on a lower surface of the circuit signal pad DDV-PD, and the insulating layer DDV-IL may include an opening OP1 to expose the circuit signal pad DDV-PD. The exposed circuit signal pad DDV-PD may have a first width $W_{OP1}$.

The conductive layer DDV-CP may be disposed on a lower surface of the insulating layer DDV-IL. The conductive layer DDV-CP may have a multi-layer structure. In an embodiment, for example, the conductive layer DDV-CP may include first and second conductive layers DDV-CP1 and DDV-CP2. The conductive layers DDV-CP1 and DDV-CP2 may be arranged inside the opening OP1 of the insulating layer DDV-IL, may be in contact with the circuit signal pad DDV-PD exposed by the opening OP1, and may be electrically connected to the circuit signal pad DDV-PD.

The conductive layer DDV-CP may be disposed on the lower surface of the insulating layer DDV-IL defining the opening OP1 therein, and the conductive layer DDV-CP may define a groove OP2 on a surface thereof facing the display panel DP. The groove OP2 of the conductive layer DDV-CP may have a second width $W_{OP2}$. The groove OP2 of the conductive layer DDV-CP is formed by depositing the conductive layer DDV-CP on a lower surface of the opening OP1 of the insulating layer DDV-IL, and thus the width $W_{OP2}$ of the groove OP2 of the conductive layer DDV-CP may be smaller than the width $W_{OP1}$ of the opening OP1 of the insulating layer DDV-IL. Here, the width $W_{OP1}$ and width $W_{OP2}$ are measured in a direction parallel to a plane defined by the first and second directions DR1 and DR2.

The adhesive layer CF1-*a* may be disposed between the display panel DP and the data driver DDV to connect the display panel DP and the data driver DDV. The adhesive layer CF1-*a* may be an anisotropic conductive film. The adhesive layer CF1-*a* may include the adhesive resin AD1 and the conductive particles CB dispersed in the adhesive resin AD1. The adhesive resin AD1 may fill a gap between the conductive particles CB and couple the display panel DP and the data driver DDV.

The adhesive resin AD1 may include a polymer material. In an embodiment, for example, the adhesive resin AD1 may include at least one of an acrylic polymer, a silicone polymer, a urethane polymer, and an imide polymer. The adhesive resin AD1 may be a portion formed by heat-curing or photo-curing a base resin such as an acrylic resin, a silicone resin, a urethane resin, or an imide resin.

The conductive particles CB may be metal particles or alloy particles in which a plurality of metals are mixed. In an embodiment, for example, the conductive particles CB may be metal particles including at least one of silver, copper, bismuth, zinc, indium, tin, nickel, cobalt, chromium, and iron, and metal alloy particles thereof. Alternatively, the conductive particles CB may have a core portion formed of a polymer resin or the like and a coating layer surrounding the core portion and made of a conductive material.

In a process of bonding the data driver DDV, the conductive particles CB may be aligned between the signal pad PD-a and the conductive layer DDV-CP of the data driver DDV corresponding to each other through pressing and thus may have anisotropy so that a current flows in a pressing direction. Accordingly, the signal pad Pd-a may be electrically connected to the circuit signal pad DDV-PD of the data driver DDV through the conductive particles CB. FIG. 9 illustrates that the conductive particles CB are partially depressed in and in contact with the conductive layer DDV-CP of the data driver DDV by pressing, but an embodiment is not limited thereto. For another example, the conductive particles CB may be in contact with the conductive layer DDV-CP of the data driver DDV and the signal pad PD-a of the display panel DP while not depressed therein.

The width $W_{OP2}$ of the groove OP2 disposed on a surface of the data driver DDV facing the display panel DP may be smaller than or equal to a diameter $D_{CB}$ of the conductive particles CB. Accordingly, a probability that the conductive particles CB fall into the groove OP2 may be reduced.

Figure 10:
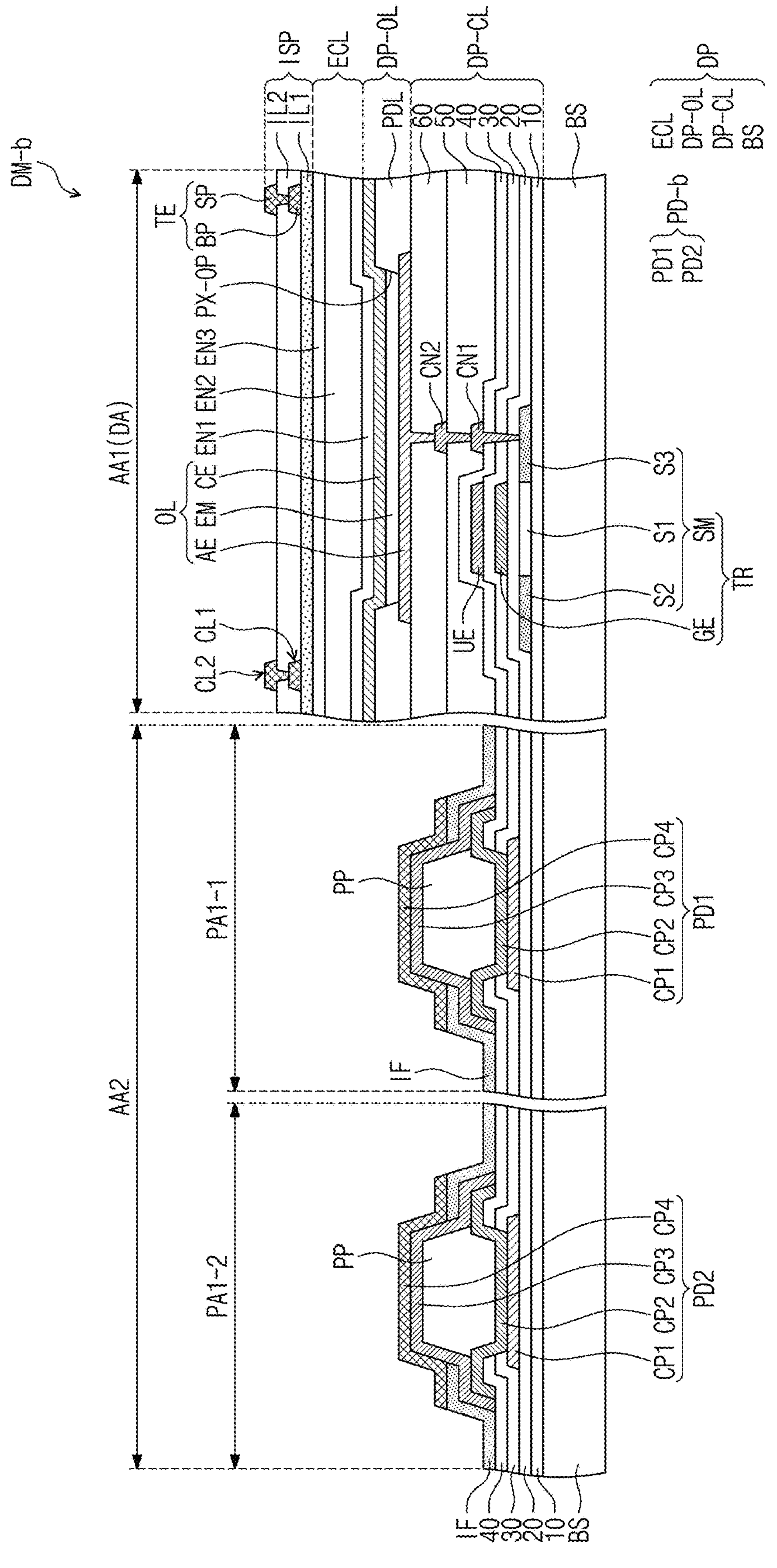
FIG. 10 is a cross-sectional view of a display module according to another embodiment of the present disclosure.

FIG. 10 is a cross-sectional view of a display module DM-b according to another embodiment of the present disclosure. FIG. 10 illustratively illustrates a cross section of the pixel PX (see FIG. 4) disposed in the first base area AA1 and the first and second signal pads PD1 and PD2 arranged in the second base area AA2. The description of FIG. 8 may be equally applied to the same configuration of FIG. 10.

Each of the first and second signal pads PD1 and PD2 may include a plurality of conductive patterns CP1, CP2, CP3, and CP4 arranged in a thickness direction. The first conductive patterns CP1 of the first signal pad PD1 and the second signal pad PD2 may be arranged on the second insulating layer 20.

The first conductive patterns CP1 of the first signal pad PD1 and the second signal pad PD2 may be formed through the same process as the producing process of the gate electrode GE of the transistor TR. In an embodiment, for example, after a conductive layer is formed on the second insulating layer 20 through a deposition process such as sputtering or chemical vapor deposition, the conductive layer may be patterned to form the first conductive patterns CP1 of the first and second signal pads PD1 and PD2 and the gate electrode GE. The first conductive patterns CP1 of the first and second signal pads PD1 and PD2 may be arranged on the same layer as the gate electrode GE of the transistor TR and include the same material.

The third insulating layer 30 and the fourth insulating layer 40 may extend from the first base area AA1 and may be arranged on the second base area AA2. Through-holes exposing upper surfaces of the first conductive patterns CP1 of the first signal pad PD1 and the second signal pad PD2 may be defined in the third insulating layer 30 and the fourth insulating layer 40. The third insulating layer 30 and the fourth insulating layer 40 may be formed by sequentially depositing insulating layers on the first base area AA1 and the second base area AA2 and then performing etching so that portions of the upper surfaces of the first conductive patterns CP1 of the first and second signal pads PD1 and PD2 are exposed.

As illustrated in FIG. 10, at least some of the insulating layers arranged inside the first base area AA1 may be arranged on the second base area AA2, and a laminate structure of the insulating layers arranged in the second base area AA2 is not particularly limited to the illustration.

The second conductive patterns CP2 of the first signal pad PD1 and the second signal pad PD2 may be arranged on the exposed upper surfaces of the first conductive patterns CP1. The second conductive patterns CP2 may be in contact with the first conductive patterns CP1, respectively. Portions of the second conductive patterns CP2 may be arranged on the fourth insulating layer 40. In an embodiment, for example, the portions of the second conductive patterns CP2 may be arranged on the fourth insulating layer 40 while covering inner surfaces of the third and fourth insulating layers 30 and 40, which are exposed by the through-holes.

The second conductive patterns CP2 of the first signal pad PD1 and the second signal pad PD2 may be formed through the same process as the producing process of any one of conductive electrodes in the circuit layer DP-CL. In an embodiment, for example, the second conductive patterns CP2 of the first signal pad PD1 and the second signal pad PD2 may be formed through the same process as the producing process of the first connection electrode CN1. After a conductive layer is formed on the fourth insulating layer 40 through the deposition process such as sputtering or chemical vapor deposition, the conductive layer may be patterned to form the second conductive patterns CP2 of the first and second signal pads PD1 and PD2 and the first connection electrode CN1. The second conductive patterns CP2 of the first and second signal pads PD1 and PD2 may be arranged on the same layer as the first connection electrode CN1 and include the same material.

Each of the first signal pad PD1 and the second signal pad PD2 may further include insulating patterns PP arranged on the second conductive patterns CP2. The insulating patterns PP may be arranged to cover only portions of the second conductive patterns CP2 and may define protrusions on the display panel DP. The insulating patterns PP may include polymers, but an embodiment is not limited thereto, and any materials may be applied to the insulating patterns PP as long as the protrusions may be defined through the materials.

The third conductive patterns CP3 of the first signal pad PD1 and the second signal pad PD2 may be arranged on the second conductive patterns CP2 while covering the insulating patterns PP, respectively. The third conductive patterns CP3 may be in contact with portions of the second conductive patterns CP2 not covered by the insulating patterns PP, respectively. The third conductive patterns CP3 of the first signal pad PD1 and the second signal pad PD2 may be formed through the same process as the producing process of any one of the conductive electrodes in the circuit layer DP-CL. In an embodiment, for example, the third conductive patterns CP3 of the first signal pad PD1 and the second signal pad PD2 may be formed through the same process as the producing process of the second connection electrode CN2. The fifth insulating layer 50 disposed below the second connection electrode CN2 may be open to correspond to an area in which the first and second signal pads PD1 and PD2 are arranged. That is, the fifth insulating layer 50 may not be disposed on the second conductive patterns CP2 of the first and second signal pads PD1 and PD2, and a portion of a conductive layer deposited on the fifth insulating layer 50 may be in contact with the second conductive patterns CP2. After a conductive layer is formed on the fifth insulating layer 50 through the deposition process such as sputtering or chemical vapor deposition, the conductive layer may be patterned to form the third conductive patterns CP3 of the first and second signal pads PD1 and PD2 and the second connection electrode CN2. The third conductive patterns CP3 may be disposed on the same layer as the layer of the second connection electrode CN2 and include the same material.

The base layer IL1 of the input detection unit ISP may extend from the first base area AA1 and may be disposed on the second base area AA2. The base layer IL1 disposed on the second base area AA2 may be defined as the insulating film IF. That is, the base layer ILL disposed on the first base area AA1 and the insulating film IF disposed on the second base area AA2 may be an integral insulating film. However, an embodiment is not limited thereto, and both the base layer IL1 and the first detection insulating layer IL2 of the input detection unit ISP may extend from the first base area AA1 and may be arranged on the second base area AA2 in another embodiment. In this case, the base layer IL1 and the first detection insulating layer IL2 laminated on the second base area AA2 may correspond to the insulating film IF.

The insulating film IF may be disposed on the first sub-pad area PA1-1 and the second sub-pad area PA1-2. The insulating film IF may be formed simultaneously with a process of forming the insulating layer (for example, the base layer IL1 or the first detection insulating layer IL2) included in the input detection unit ISP. In an embodiment, for example, after the insulating layer is deposited on the first and second base areas AA1 and AA2 through the deposition process such as the chemical vapor deposition, the insulating layer may be etched or patterned to form the base layer IL1 (or the first detection insulating layer IL2) and the insulating film IF.

The insulating film IF may include an inorganic material, and may prevent inflow of moisture or oxygen. In an embodiment, for example, the insulating film IF may include at least one of aluminum oxide, titanium oxide, silicon oxide, silicon oxynitride, zirconium oxide, and hafnium oxide. However, the material of the insulating film IF is not limited to the above example.

A plurality of openings may be defined in the insulating film IF. The upper surfaces of the third conductive patterns CP3 covering the insulating patterns PP and protruding by the insulating patterns PP may be exposed in the opening of the insulating film IF.

The fourth conductive patterns CP4 of the first signal pad PD1 and the second signal pad PD2 may be arranged on the upper surfaces of the third conductive patterns CP3, which are exposed from the insulating film IF. The fourth conductive patterns CP4 may be in contact with the third conductive patterns CP3. The fourth conductive patterns CP4 of the first signal pad PD1 and the second signal pad PD2 may extend from the upper surfaces of the third conductive patterns CP3 exposed from the insulating film IF and may be arranged on a portion of the insulating film IF. However, an embodiment is not necessarily limited thereto.

The fourth conductive patterns CP4 of the first signal pad PD1 and the second signal pad PD2 may be formed through the same process as the producing process of any one of the conductive layers of the input detection unit ISP. In an embodiment, for example, the fourth conductive patterns CP4 of the first signal pad PD1 and the second signal pad PD2 may be formed through the same process as the producing process of the first detection conductive layer CL1 or the second detection conductive layer CL2. As an example, after the base layer IL1 and the insulating film IF are formed, the conductive layer is formed thereon through the deposition process such as sputtering or chemical vapor deposition. Thereafter, the conductive layer may be patterned to form the first detection conductive layer CL1 and the fourth conductive patterns CP4 of the first and second signal pads PD1 and PD2. The fourth conductive patterns CP4 may include the same material as the material of the first detection conductive layer CL1 or the second detection conductive layer CL2.

Figure 11:
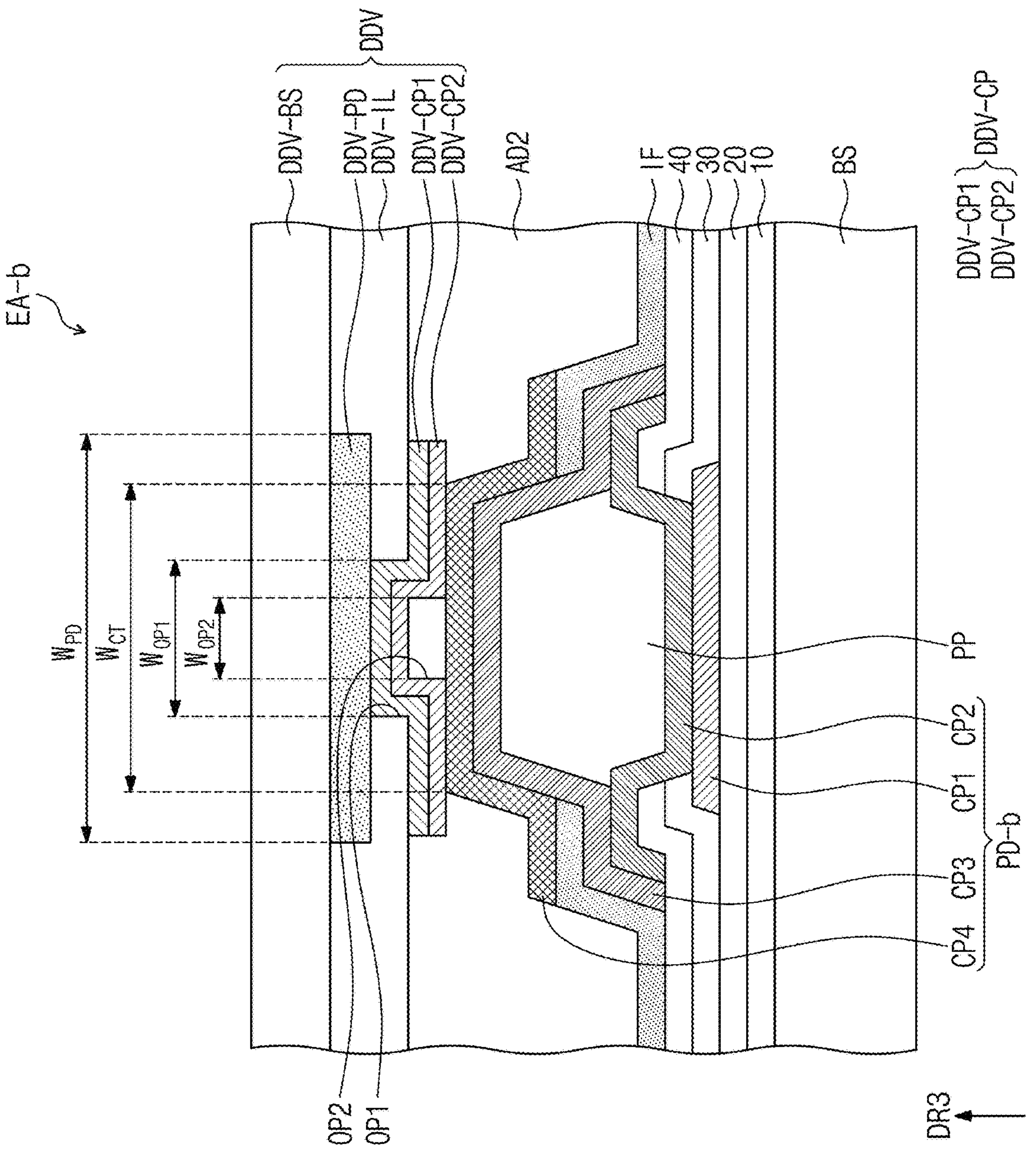
FIG. 11 is a cross-sectional view of the electronic device according to an embodiment of the present disclosure.

FIG. 11 is a cross-sectional view of an electronic device EA-b according to an embodiment of the present disclosure. FIG. 11 illustratively illustrates a cross section of the electronic device EA-b in which the data driver DDV is bonded onto the display panel DP illustrated in FIG. 10. The above description may be equally applied to components of the display panel DP illustrated in FIG. 11, and the same description will be omitted below.

The first and second conductive patterns CP1 and CP2 of FIGS. 10 and 11 may be collectively referred to as a first conductive pattern, and the third and fourth conductive patterns CP3 and CP4 may be collectively referred as a second conductive pattern.

FIG. 11 is a cross section corresponding to the first sub-pad area PA1-1 and the second sub-pad area PA1-2 of the second base area AA2 of FIG. 10. That is, a signal pad PD-b of FIG. 11 may correspond to the first and second signal pads PD1 and PD2 of FIG. 10.

Referring to FIG. 11, the electronic device EA-b may include an adhesive layer AD2 disposed between the display panel DP and the data driver DDV. The adhesive layer AD2 of FIG. 11 may correspond to a detailed illustration of an embodiment of the first adhesive layer CF1 of FIG. 6.

The data driver DDV may include the base layer DDV-BS in which the circuit signal pad DDV-PD is disposed, the circuit signal pad DDV-PD, the conductive layer DDV-CP electrically connected to the circuit signal pad DDV-PD, and the insulating layer DDV-IL.

The circuit signal pad DDV-PD may be an output pad that is disposed to correspond to the first signal pad PD1 (see FIG. 6) and outputs a signal to the first signal pad PD1 (see FIG. 6) and an input pad that is disposed to correspond to the second signal pad PD2 (see FIG. 6) and receives a signal from the second signal pad PD2 (see FIG. 6). The circuit signal pad DDV-PD may include aluminum (Al).

The insulating layer DDV-IL may be disposed on the lower surface of the circuit signal pad DDV-PD, and the insulating layer DDV-IL may include the opening OP1 to expose the circuit signal pad DDV-PD. The exposed circuit signal pad DDV-PD may have the first width $W_{OP1}$.

The conductive layer DDV-CP may be disposed on the lower surface of the insulating layer DDV-IL. The conductive layer DDV-CP may have a multi-layer structure. In an embodiment, for example, the conductive layer DDV-CP may include the first and second conductive layers DDV-CP1 and DDV-CP2. The conductive layers DDV-CP1 and DDV-CP2 may be arranged inside the opening OP1 of the insulating layer DDV-IL, may be in contact with the circuit signal pad DDV-PD exposed by the opening OP1, and may be electrically connected to the circuit signal pad DDV-PD.

The conductive layer DDV-CP may be disposed on the lower surface of the insulating layer DDV-IL having the opening OP1, and the conductive layer DDV-CP may include the groove OP2 on the surface thereof facing the display panel DP. The groove OP2 of the conductive layer DDV-CP may have the second width $W_{OP2}$. The groove OP2 of the conductive layer DDV-CP is formed by depositing the conductive layer DDV-CP on a lower surface of the opening OP1 of the insulating layer DDV-IL, and thus the width $W_{OP2}$ of the groove OP2 of the conductive layer DDV-CP may be smaller than the width $W_{OP1}$ of the opening OP1 of the insulating layer DDV-IL.

The adhesive layer AD2 may be disposed between the display panel DP and the data driver DDV to connect the display panel DP and the data driver DDV. The adhesive layer AD2 may be a non-conductive film. The adhesive layer AD2 may include an adhesive resin.

The adhesive resin may include a polymer material. In an embodiment, for example, the adhesive resin may include at least one of an acrylic polymer, a silicone polymer, a urethane polymer, and an imide polymer. The adhesive resin may be a portion formed by heat-curing or photo-curing a base resin such as an acrylic resin, a silicone resin, a urethane resin, or an imide resin.

The fourth conductive patterns CP4 of the display panel DP may be electrically connected to the conductive layer DDV-CP of the data driver DDV while in contact with the conductive layer DDV-CP due to the protrusions defined in the display panel DP. Further, the width $W_{OP2}$ of the groove OP2 defined in the conductive layer DDV-CP of the data driver DDV may be smaller than or equal to a width $W_{CT}$ of an upper surface (i.e., top surface) of the fourth conductive patterns CP4. The width $W_{OP1}$ of the opening OP1 of the insulating layer DDV-IL of the data driver DDV may be smaller than or equal to ⅓ a width $W_{PD}$ of the circuit signal pad DDV-PD.

Referring to FIGS. 9 and 11 together, in the electronic devices EA-a and EA-b according to the present disclosure, a separate conductive member such as a bump below the conductive layer DDV-CP of the data driver DDV is not required, and a problem of short circuit due to flow of conductive particles and a problem of poor conduction due to dimples of bumps may not occur. Further, as the separate conductive member such as the bump is omitted, a thickness of the adhesive layer CF1-*a* and AD2 for bonding the data driver DDV and the display panel DP may be reduced.

Figure 12:
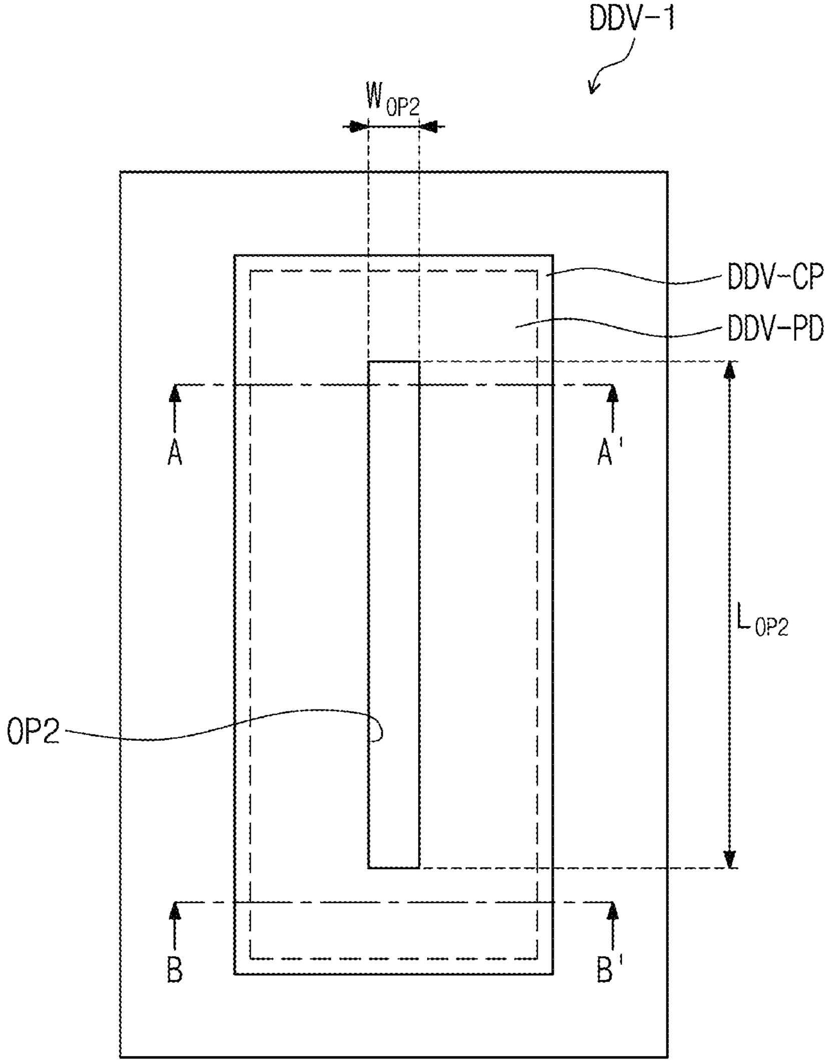
FIG. 12 is a plan view of a data driver according to an embodiment of the present disclosure.
Figure 13:
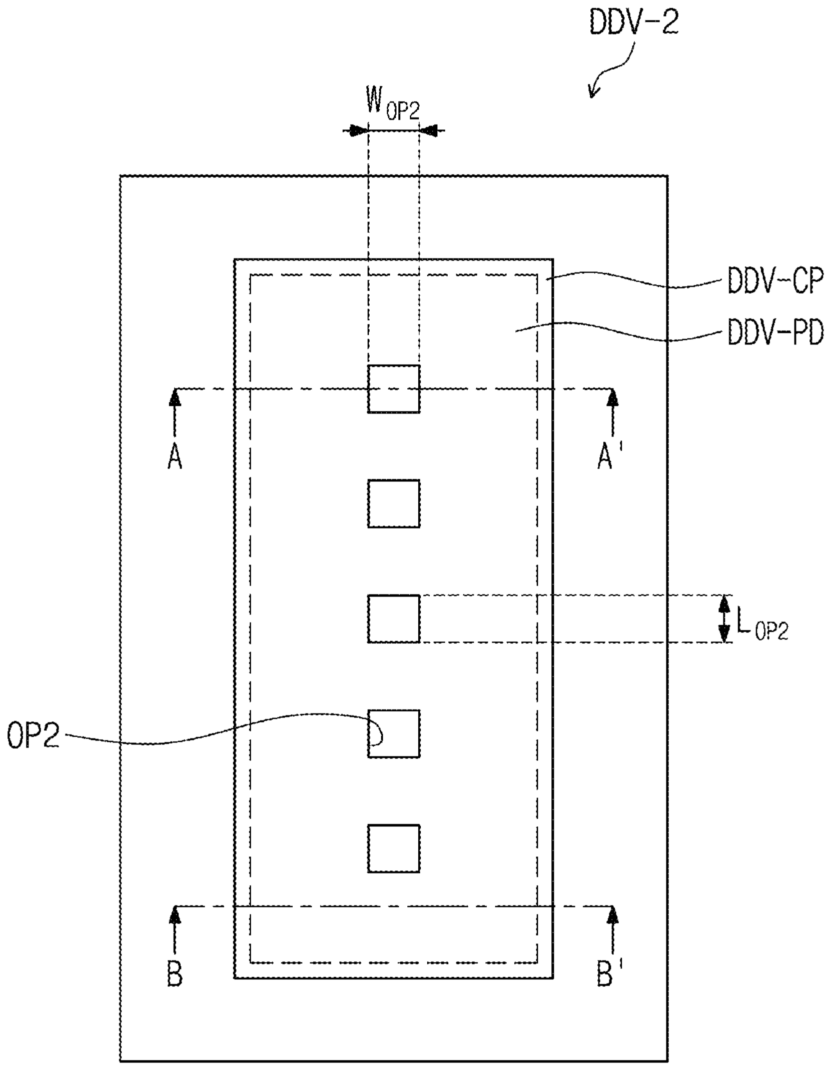
FIG. 13 is a plan view of a data driver according to another embodiment of the present disclosure.
Figure 14:
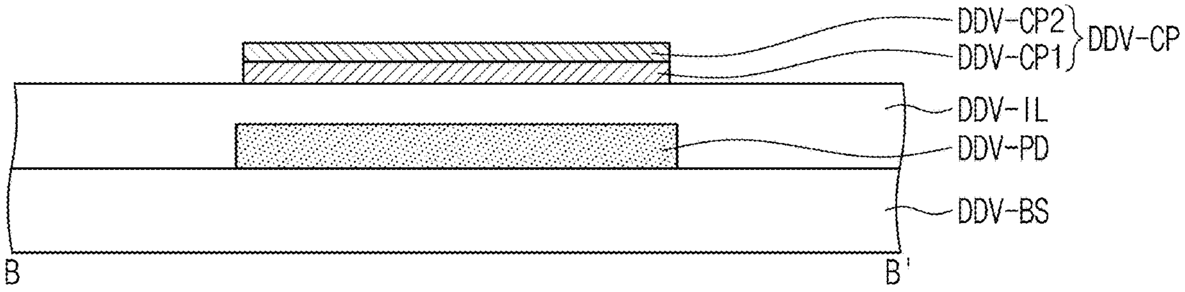
FIGS. 14 to 15C are cross-sectional views of the data driver according to an embodiment of the present disclosure.

FIG. 12 is a plan view of a data driver DDV-1 according to an embodiment of the present disclosure. FIG. 13 is a plan view of a data driver DDV-2 according to another embodiment of the present disclosure. FIGS. 14 to 15C are cross-sectional views of the data driver according to an embodiment of the present disclosure.

FIGS. 12 and 13 are plan views illustratively illustrating the data driver DDV of FIGS. 9 and 11. The above description may be equally applied to FIGS. 12 and 13.

As described above in FIG. 9, the width $W_{OP2}$ of the groove OP2 (see FIG. 9) of the conductive layer DDV-CP of the data driver DDV-1 or DDV-2 may be smaller than or equal to the diameter $D_{CB}$ (see FIG. 9) of the conductive particles CB (see FIG. 9). Alternatively, as illustrated in FIG. 11, the width $W_{OP2}$ of the groove OP2 (see FIG. 9) may be smaller than or equal to the width $W_{CT}$ (see FIG. 11) of the upper surface (i.e., top surface) of the protrusion of the display panel DP (see FIG. 11).

Referring to FIG. 12, a length $L_{OP2}$ of the groove OP2 (see FIGS. 9 and 11) may be greater than the width $W_{OP2}$.

Referring to FIG. 13, the length $L_{OP2}$ of the groove OP2 (see FIGS. 9 and 11) may be smaller than or equal to the diameter $D_{CB}$ (see FIG. 9) of the conductive particles CB (see FIG. 9). Alternatively, the length $L_{OP2}$ of the groove OP2 (see FIG. 9) may be smaller than or equal to the width $W_{CT}$ (see FIG. 11) of the upper surface (i.e., top surface) of the protrusion of the display panel DP (see FIG. 11).

FIG. 14 illustratively illustrates a cross section along line B-B' of FIGS. 12 and 13. That is, FIG. 14 illustrates a cross section of a portion without the groove OP2 (see FIGS. 9 and 11). The same description as described above may be applied to the respective components.

Figure 15A:
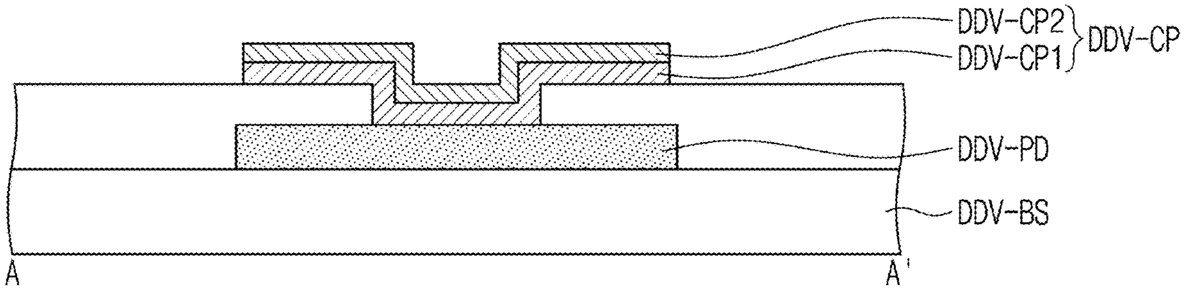
Figure 15B:
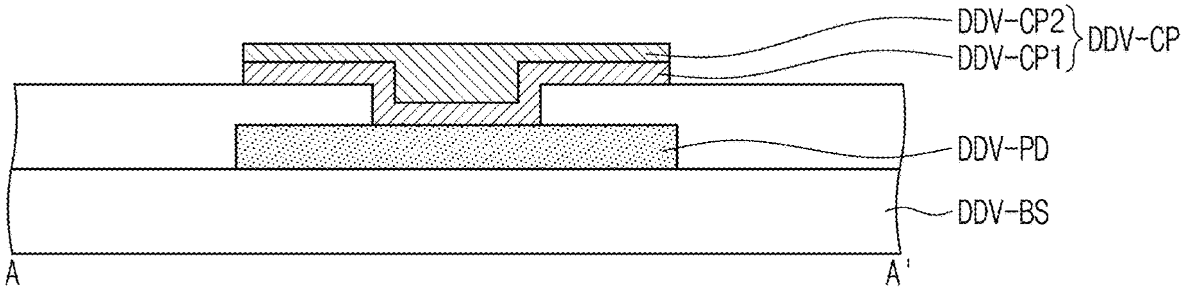
Figure 15C:
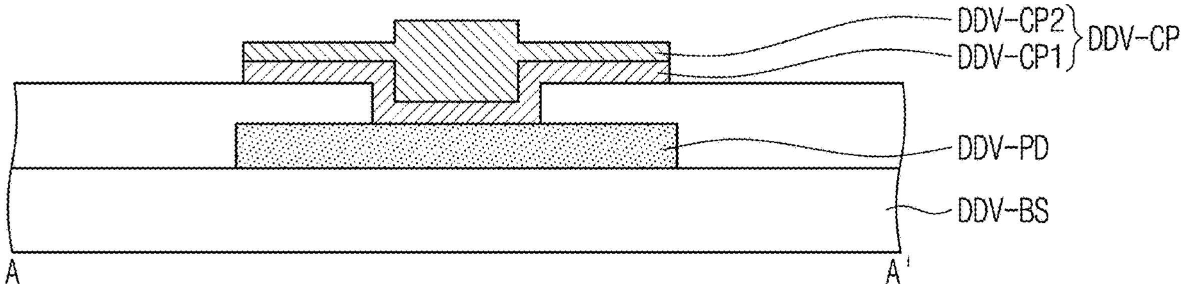

FIGS. 15A to 15C illustratively illustrate a cross section along line A-A' of FIGS. 12 and 13. That is, FIGS. 15A to 15C illustrate a cross section of a portion with the groove OP2 (see FIGS. 9 and 11).

FIG. 15A is a cross-sectional view of the same data driver DDV as in FIGS. 9 and 11. FIG. 15B illustrates a structure in which the upper surface of the conductive layer DDV-CP is flatly filled as compared to FIG. 15A. That is, a thickness of a portion of the conductive layer DDV-CP in contact with the circuit signal pad DDV-PD may be the same as a thickness of a portion of the conductive layer DDV-CP not in contact with the circuit signal pad DDV-PD.

FIG. 15B illustrates a structure in which the upper surface of the conductive layer DDV-CP includes the protrusion as compared to FIG. 15A. That is, the thickness of the portion of the conductive layer DDV-CP in contact with the circuit signal pad DDV-PD may be greater than the thickness of the portion of the conductive layer DDV-CP not in contact with the circuit signal pad DDV-PD.

In the case of the structures of FIGS. 15B and 15C, a probability that the conductive particles CB (see FIG. 9) fall may be further reduced. The same description as described above may be applied to the respective components.

As described above, a data driver of an electronic device according to the present disclosure does not include a bump and has a structure in which a width of a groove of the data driver is smaller or equal to a diameter of a conductive particle or a width of an upper surface of a protrusion of a display panel, and thus electrical connection characteristics of the display panel and the data driver may be effectively improved.

Although the description has been made above with reference to an embodiment of the present disclosure, it may be understood that those skilled in the art or those having ordinary knowledge in the art may variously modify and changes the present disclosure without departing from the spirit and technical scope of the present disclosure described in the appended claims. Accordingly, the technical scope of the present disclosure is not limited to the detailed description of the specification, but should be defined by the appended claims.

What is claimed is:

1. An electronic device comprising:
- a display panel including a first pad;
- a data driver including a second pad disposed to overlap the first pad in a thickness direction of the display panel and disposed on the display panel; and
- an adhesive layer disposed between the display panel and the data driver,
- wherein the first pad includes:
  - a first conductive pattern;
  - an insulating pattern disposed on the first conductive pattern and configured to define a protrusion protruding in a direction from the display panel toward the data driver; and
  - a second conductive pattern disposed on the insulating pattern,
- wherein the second conductive pattern is in contact with and electrically connected to the data driver,
- the data driver includes a groove defined in a surface thereof facing the display panel, and
- a length of the groove in a first direction perpendicular to the thickness direction is smaller than or equal to a length of a top surface of the second conductive pattern in the first direction.

2. The electronic device of claim 1,
- wherein the data driver further includes:
  - an insulating layer defining an opening exposing a portion of the second pad and disposed under the second pad; and
  - a conductive layer in which the groove is defined and which is disposed under the insulating layer while covering the exposed portion of the second pad,
- wherein the second conductive pattern is in contact with and electrically connected to the conductive layer of the data driver.

3. The electronic device of claim 2, wherein a length of the opening of the insulating layer in the first direction is smaller than or equal to ⅓ a length of the second pad in the first direction.

4. The electronic device of claim 2, wherein the adhesive layer is a non-conductive film.

5. The electronic device of claim 2, wherein the insulating pattern includes a polymer.

6. An electronic device comprising:
- a display panel including a first pad;
- a data driver including a second pad disposed to overlap the first pad in a thickness direction of the display panel and disposed on the display panel; and
- an adhesive layer disposed between the display panel and the data driver,
- wherein the first pad includes:
  - a first conductive pattern;
  - an insulating pattern disposed on the first conductive pattern and configured to define a plurality of protrusions protruding in a direction from the display panel toward the data driver; and
  - a second conductive pattern disposed on the insulating pattern, wherein protruding portions of the second conductive pattern corresponding to the plurality of protrusions of the insulating pattern are in contact with and electrically connected to the data driver, the data driver defines a plurality of grooves arranged in a surface thereof facing the display panel and spaced apart from each other in a second direction perpendicular to the thickness direction, a length of each of the plurality of grooves in a first direction perpendicular to both the thickness direction and the second direction is smaller than or equal to a length of each of top surfaces of the protruding portions of the second conductive pattern in the first direction, and a length of each of the plurality of grooves in the second direction is smaller than or equal to a length of each of the top surfaces of the protruding portions of the second conductive pattern in the second direction.

7. The electronic device of claim 6, wherein the data driver includes:

an insulating layer defining a plurality of openings exposing a portion of the second pad and disposed under the second pad; and a conductive layer in which the plurality of grooves are defined and which is disposed under the insulating layer while covering the exposed portion of the second pad, wherein the protruding portions of the second conductive pattern are in contact with and electrically connected to the conductive layer of the data driver.

8. The electronic device of claim 7, wherein a length of each of the plurality of openings of the insulating layer in the first direction is smaller than or equal to ⅓ a length of the second pad in the first direction.

9. The electronic device of claim 6, wherein the adhesive layer is a non-conductive film.

10. The electronic device of claim 6, wherein the insulating pattern includes a polymer.

* * * * *